(12) United States Patent
Christiansen et al.

(10) Patent No.: US 6,855,649 B2
(45) Date of Patent: *Feb. 15, 2005

(54) RELAXED SIGE LAYERS ON SI OR SILICON-ON-INSULATOR SUBSTRATES BY ION IMPLANTATION AND THERMAL ANNEALING

(75) Inventors: Silke H. Christiansen, Halle (DE); Jack O. Chu, Manhasset Hill, NY (US); Alfred Grill, White Plains, NY (US); Patricia M. Mooney, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

This patent is subject to a terminal disclaimer.

(21) Appl. No.: 10/299,880

(22) Filed: Nov. 19, 2002

(65) Prior Publication Data

US 2003/0218189 A1 Nov. 27, 2003

Related U.S. Application Data

(63) Continuation-in-part of application No. 10/115,160, filed on Apr. 3, 2002, now Pat. No. 6,593,625.
(60) Provisional application No. 60/297,496, filed on Jun. 12, 2001.

(51) Int. Cl.$^7$ .............................................. H01L 21/00
(52) U.S. Cl. ...................................... 438/933; 438/311
(58) Field of Search ................................ 438/933, 149, 438/311, 77, 481, 482, 483, 680, 681, 752, 753, 94, 172, 506–510, 514, 518, 522, 530, 475, 478, 479, 692, 712

(56) References Cited

U.S. PATENT DOCUMENTS

| | | | | |
|---|---|---|---|---|
| 4,962,051 A | * | 10/1990 | Liaw | 438/680 |
| 5,908,313 A | * | 6/1999 | Chau et al. | 438/299 |
| 6,121,100 A | * | 9/2000 | Chau et al. | 438/305 |
| 6,165,826 A | * | 12/2000 | Chau et al. | 438/231 |
| 6,190,937 B1 | * | 2/2001 | Nakagawa et al. | 438/67 |
| 6,251,720 B1 | * | 6/2001 | Thakur et al. | 438/240 |
| 6,489,241 B1 | * | 12/2002 | Thilderkvist et al. | 438/689 |
| 6,562,703 B1 | | 5/2003 | Maa et al. | 438/518 |
| 6,593,191 B2 | | 7/2003 | Fitzgerald | 438/282 |
| 6,709,903 B2 | * | 3/2004 | Christiansen et al. | 438/149 |

* cited by examiner

Primary Examiner—David Nhu
(74) Attorney, Agent, or Firm—Scully, Scott, Murphy & Presser; Robert M. Trepp, Esq.

(57) ABSTRACT

A method to obtain thin (less than 300 nm) strain-relaxed $Si_{1-x}Ge_x$ buffer layers on Si or silicon-on-insulator (SOI) substrates. These buffer layers have a homogeneous distribution of misfit dislocations that relieve the strain, remarkably smooth surfaces, and a low threading dislocation (TD) density, i.e. less than $10^6$ cm$^2$. The approach begins with the growth of a pseudomorphic or nearly pseudomorphic $Si_{1-x}Ge_x$ layer, i.e., a layer that is free of misfit dislocations, which is then implanted with He or other light elements and subsequently annealed to achieve the substantial strain relaxation. The very effective strain relaxation mechanism operating with this method is dislocation nucleation at He-induced platelets (not bubbles) that lie below the $Si/Si_{1-x}Ge_x$ interface, parallel to the Si(001) surface.

63 Claims, 26 Drawing Sheets

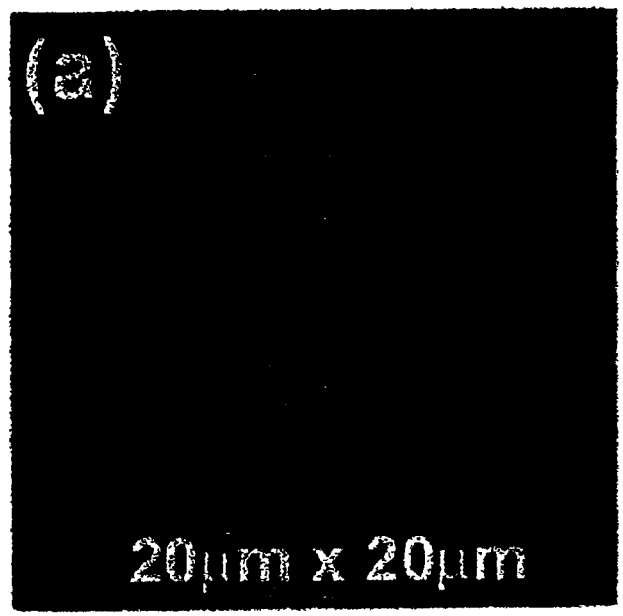
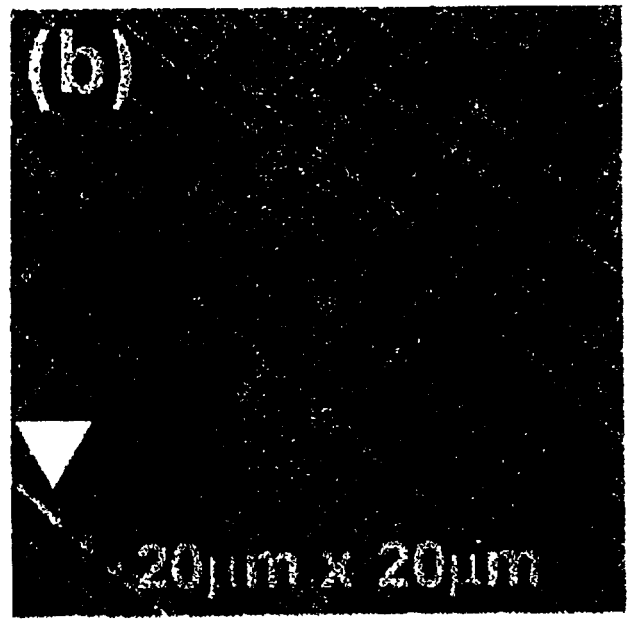
Fig. 23

RELAXED SIGE LAYERS ON SI OR SILICON-ON-INSULATOR SUBSTRATES BY ION IMPLANTATION AND THERMAL ANNEALING

RELATED APPLICATIONS

This application is a continuation-in-part application of U.S. application Ser. No. 10/115,160 filed Apr. 3, 2002 now U.S. Pat. No. 6,593,625 which in turn claimed the benefit of U.S. Provisional Application No. 60/297,496, filed Jun. 12, 2001. This application is related to U.S. application Ser. No. 10/037,611, filed Jan. 4, 2002 the entire content of which is incorporated herein by reference.

FIELD OF THE INVENTION

The present invention relates to a process of fabricating a so-called "virtual substrate" as well as the virtual substrate and the use thereof in semiconductor devices such as modulation-doped field effect transistors (MODFETs), metal oxide field effect transistors (MOSFETs), strained silicon-based complementary metal oxide semiconductor (CMOS) devices and other devices that require fully-relaxed SiGe layers. The virtual substrate of the present invention contains Si and Ge in a crystalline layer that assumes the bulk lattice constant of a $Si_{1-x}Ge_x$ alloy on either a lattice mismatched Si wafer or silicon-on-insulator (SOI) wafer.

BACKGROUND OF THE INVENTION

In the semiconductor industry, the $Si/Si_{1-x}Ge_x$ heteroepitaxial materials system is of strong interest for future microelectronic applications because the electronic properties of lattice mismatched heterostructures can be tailored for a variety of applications by exploiting band offsets at the interfaces. The most popular application of the $Si/Si_{1-x}Ge_x$ system is heterojunction bipolar transistors (HBTs) that require deposition of a pseudomorphic, i.e., compressively strained so that the in-plane lattice parameter of the layer matches that of the Si substrate, compositionally graded $Si_{1-x}Ge_x$ layer onto the Si substrate. Metal oxide semiconductor field effect transistors (MOSFETs) and modulation-doped field effect transistors (MODFETs) require Si layers under tensile strain to obtain proper conduction band offsets at the interface that enable the formation of a 2D electron gas in the Si quantum well which results in extremely high-electron mobility (on the order of about five to ten times larger than in unstrained Si at room temperature). Si layers under tensile strain are obtained by epitaxial growth on a strain-relaxed $Si_{1-x}Ge_x$ buffer layer (x=0.150.35). As mentioned in P. M. Mooney, Mater. Sci. Eng. R17, 105(1996) and F. Schaeffler, Semiconductor Sci. Tech. 12, 1515 (1997), the strain-relaxed $Si_{1-x}Ge_x$ buffer layer in conjunction with the Si or SOI substrate constitute the so-called "virtual substrate". It is noted that the term "SiGe" is used sometimes herein to refer to the $Si_{1-x}Ge_x$ layer.

The growth of the strain-relaxed $Si_{1-x}Ge_x$ buffer layer itself is a challenging task since strain relaxation involves controlled nucleation, propagation and interaction of misfit dislocations that terminate with threading arms that extend to the wafer surface and are replicated in any subsequently grown epitaxial layers. These defects are known to have deleterious effects on the properties of electronic and optoelectronic devices. The crystalline quality of the relaxed SiGe layer can be improved by growing compositionally graded buffer layers with thicknesses of up to several micrometers. By using such a technique, the threading dislocation (TD) density in an epitaxial layer grown on top of a buffer layer was reduced from $10^{10}$ to $10^{11}$ cm$^{-2}$ for a single uniform composition layer to $10^6$ to $5 \times 10^7$ cm$^{-2}$ for a graded composition buffer layer. The major drawback of thick SiGe buffer layers (usually a 1–3 micrometer thickness is necessary to obtain greater than 95% strain relaxation, when x=0.3) is the high threading dislocation density and the inhomogeneous distribution of threading dislocations over the whole wafer surface. Some regions have relatively low threading dislocation densities and primarily individual threading dislocations; but other areas contain bundles of threading dislocations as a result of dislocation multiplication which creates dislocation pileups (see, for example, F. K. Legoues, et al., J. Appl. Phys. 71, 4230 (1992) and E. A. Fitzgerald, et al., J. Vac. Sci. and Techn., B10 1807 (1992)). Moreover, blocking or dipole formation may occur, in some instances, due to dislocation interactions (see E. A. Stach, Phys. Rev. Lett. 84, 947 (2000)).

Surface pits that tend to line up in rows are typically found in the latter areas, thus making these regions of the wafer unusable for many electronic devices. Electronic devices on thick graded $Si_{1-x}Ge_x$ buffer layers also exhibit self-heating effects since SiGe alloys typically have a much lower thermal conductivity than Si. Therefore, devices fabricated on thick SiGe buffer layers are unsuitable for some applications. In addition, the thick graded $Si_{1-x}Ge_x$ buffer layers derived from dislocation pileups have a surface roughness of 10 nm on average, which typically makes such buffer layers unsuitable for device fabrication. For example, it is impossible to use these layers directly for wafer bonding. For that purpose an additional chemical-mechanical polishing (CMP) step is required.

Various strategies have been developed to further reduce the threading dislocation density as well as the surface roughness including:

1) The use of an initial low-temperature (LT) buffer layer grown at 450° C. and subsequent layer growth at temperatures between 750° and 850° C. This prior art method makes use of the agglomeration of point defects in the LT buffer layers that occurs at the higher growth temperatures. The agglomerates serve as internal interfaces where dislocations can nucleate and terminate. As a result, the misfit dislocation density that is responsible for the relaxation is maintained, while the threading dislocation density is reduced. LT buffer layers can only be grown by molecular beam epitaxy (MBE); this prior art approach cannot be implemented using UHV-CVD.

2) The use of substrate patterning, e.g., etched trenches, to create small mesas, approximately 10–30 micrometers on a side. The trenches serve as sources/sinks for dislocations to nucleate/terminate. When a dislocation terminates at a trench, no threading dislocation is formed; however, the misfit segment present at the Si/SiGe interface contributes to strain relaxation. The major drawback with this prior art method is loss of flexibility in device positioning and the loss of usable area. Moreover, it is difficult to obtain high degrees of relaxation (greater than 80%).

Neither the conventional graded buffer layer methods to achieve strain-relaxed $Si_{1-x}Ge_x$ buffer layers for virtual substrates, nor the alternative approaches to reduce the density of threading dislocations described above provide a solution that fully satisfies the material demands for device applications, i.e., a sufficiently low-threading dislocation density, control over the distribution of the threading dislocations and an acceptable surface smoothness.

In some cases, He ion implantation has been employed in forming relaxed SiGe layers. Ion implantation of He into semiconductors is well-known to form bubbles that can be degassed and enlarged (Ostwald ripening) during subsequent annealing (see, for example, H. Trinkaus, et al., Appl. Phys. Lett. 76, 3552 (2000), and D. M. Follstaedt, et al., Appl. Phys. Lett. 69, 2059 (1996)). The bubbles have been evaluated for uses such as gettering metallic impurities or altering electronic properties of semiconductors. Moreover, the bubbles have also been evaluated as sources for heterogeneous dislocation nucleation.

It has also been shown that the binding energy between bubbles and dislocations is quite large (about 600 eV for a 10 nm radius of the bubble) and that the interaction of He bubbles with dislocations significantly alters the misfit dislocation pattern. It consists of very short (<50 nm) misfit dislocation segments rather than the longer (greater than 1 $\mu$m) ones that occur in graded buffer layer growth. The interaction of He bubbles with dislocations also significantly changes the relaxation behavior of strained $Si_{1-x}Ge_x$ layers. Moreover, the degree of relaxation is greater compared to an unimplanted control sample when the same heat treatment is applied to both samples. To achieve significant strain relaxation, a dose of $2\times10^{16}$ cm$^{-2}$ He implanted about 80 nm below the Si/SiGe interface is required (M. Luysberg, D. Kirch, H. Trinkaus, B. Hollaender, S. Lenk, S. Mantl, H. J. Herzog, T. Hackbarth, P. F. Fichtner, Microscopy on Semiconducting Materials, IOP publishing, Oxford 2001). Although the strain relaxation mechanism is very different from that which occurs in graded buffer layers, the threading dislocation density remains unsatisfactorily large (>$10^7$ cm$^{-2}$ at best for $Si_{0.80}Ge_{0.20}$). Lower threading dislocation densities are obtained only when little strain relaxation occurs.

In view of the drawbacks mentioned-above with prior art approaches for fabricating strain-relaxed $Si_{1-x}Ge_x$ buffer layers on Si substrates as well as on silicon-on-insulator substrates (SOI), there exists a need to develop a new and improved process which is capable of fabricating strain-relaxed $Si_{1-x}Ge_x$ buffer layers on Si or silicon-on-insulator (SOI) substrates having a reduced threading dislocation density, a homogeneous distribution of misfit dislocations and a remarkably low surface smoothness.

SUMMARY OF THE INVENTION

One aspect of the present invention relates to a process of fabricating a relaxed $Si_{1-x}Ge_x$ buffer layer having a low-density of threading dislocations on a single crystalline surface. Broadly, the inventive process, which forms a so-called "virtual substrate" comprises the steps of: depositing a strictly pseudomorphic epitaxial layer of $Si_{1-x}Ge_x$ (i.e., a layer that is completely free of dislocations) on a single crystalline surface of a substrate or depositing a nearly pseudomorphic epitaxial layer of $Si_{1-x}Ge_x$ (i.e., a layer that is nearly free of dislocations) on a single crystalline surface of a substrate; ion implanting atoms of a light element such as He into the substrate; and annealing the substrate at a temperature above 650° C.

Even though He implantation is known, applicants have determined optimum processing conditions for implanting He ions below the $Si/Si_{1-x}Ge_x$ interface and subsequent thermal annealing that yield a quite different relaxation mechanism resulting in a reduced threading dislocation density (e.g., $10^4$–$10^6$ cm$^{-2}$ for $Si_{0.85}Ge_{0.15}$) of a thin (less than 300 nm) SiGe layer.

It is of key importance for successful device performance that the strain-relaxed single crystal $Si_{1-x}Ge_x$ layer contains as few defects, which are primarily threading dislocations (TDs), as possible; the upper limit that can be tolerated for threading dislocations mentioned in recent publications is $10^6$ cm$^{-2}$. Using the inventive process, it is possible to obtain relaxed $Si_{1-x}Ge_x$ layers having threading dislocation densities below this limit, in contrast to the commonly used state-of-the-art linearly or step-graded buffer layers that typically have threading dislocations in the range between $1\times10^6$ to $5\times10^7$ cm$^{-2}$ on 8" wafers at alloy compositions as high as $Si_{0.8}Ge_{0.2}$.

Another aspect of the present invention relates to a virtual substrate that is formed using the inventive process. Specifically, the inventive virtual substrate comprises a substrate; and a partially relaxed single crystalline $Si_{1-x}Ge_x$ layer atop the substrate, wherein the partially relaxed single crystalline $Si_{1-x}Ge_x$ layer has a thickness of less than about 300 nm, a threading dislocation density of less than $10^6$ cm$^{-2}$, and significant relaxation of greater than 30%.

In some embodiments of the present invention, the epitaxial $Si_{1-x}Ge_x$ layer includes C having a concentration of from about $1\times10^{19}$ to about $2\times10^{21}$ cm$^{-3}$ therein.

A still further aspect of the present invention relates to semiconductor structures that are formed using the processing steps of the present invention. Broadly, the inventive semiconductor structure comprises:

a substrate;

a first single crystalline layer atop said substrate;

a second highly defective single crystalline layer atop said first single crystalline layer, said second highly defective single crystalline layer comprising planar defects which serve as sources and sinks of dislocation loops;

a third single crystalline layer of essentially the same composition as the first single crystalline layer, said third single crystalline layer comprising threading dislocations terminating at the interface formed between the third and fourth layers; and a fourth relaxed single crystalline layer having a lattice parameter different from said third layer formed atop said third layer.

BRIEF DESCRIPTION OF THE DRAWINGS

FIGS. 23A and 23B are AFM micrographs of a nearly pseudomorphic 334 nm-thick Si$_{1-x}$Ge$_x$ layer grown epitaxially by UHVCVD on a Si (001) substrate. In particular, FIG. 23A shows an as-grown sample before implantation and annealing and FIG. 23B shows a sample after implantation of He+. The arrow in FIG. 23B points to a misfit dislocation pile-up.

DETAILED DESCRIPTION OF THE INVENTION

Figure 1A:
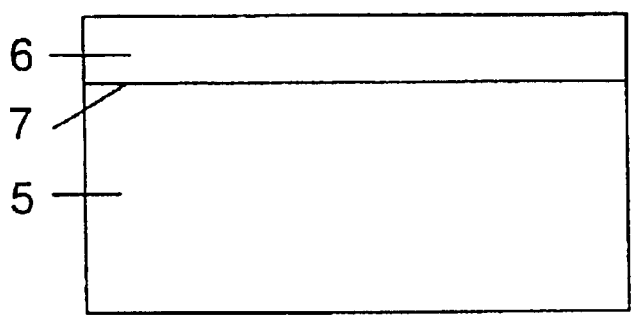
FIGS. 1A–1C are pictorial representations (through cross-sectional views) showing the basic processing step employed in the present invention in forming a thin, fully-relaxed SiGe buffer layer on a Si substrate or SOI wafer, i.e., virtual substrate.

The present invention, which provides a process of fabricating virtual substrates as well as structures containing the same, will now be described in more detail by referring to the drawings that accompany the present application.

Figure 1B:
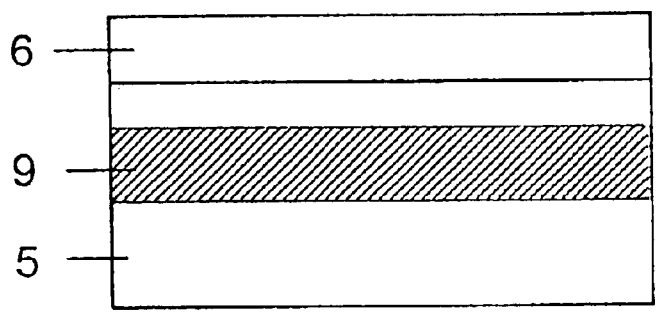
Figure 1C:
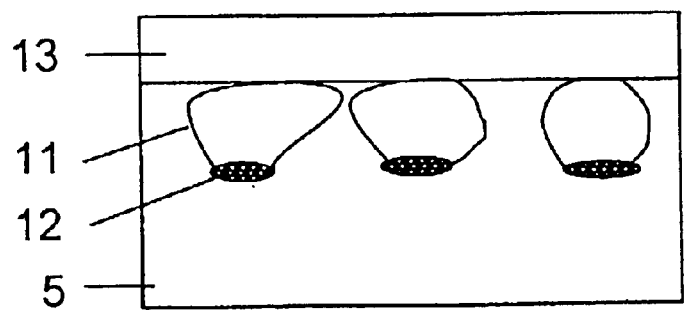

Reference is first made to FIGS. 1A–C, which illustrate the basic processing steps employed in fabricating the inventive virtual substrate. It is noted that the term "virtual substrate" is used herein to denote a structure which includes a substrate (bulk Si or SOI) that has a relaxed single crystalline Si$_{1-x}$Ge$_x$ layer formed thereon, wherein the relaxed single crystalline Si$_{1-x}$Ge$_x$ layer has a thickness of less than about 300 nm, a threading dislocation density of less than $10^6$ cm$^{-2}$, and a degree of relaxation depending on the layer thickness, i.e. between 30% for about 100 nm thick layers and 80% for about 200 nm thick layers.

First, and as shown in FIG. 1A, a thin, strictly pseudomorphic Si$_{1-x}$Ge$_x$ layer 6 is deposited on a single crystalline surface of substrate 5 using any epitaxial growing process which is capable of forming such a layer on top of substrate 5; substrate 5 may be comprised of bulk Si or an SOI material. An SOI material includes a buried insulating region that electrically isolates a top Si-containing layer from a bottom Si-containing layer. In one embodiment of the present invention, thin, strictly pseudomorphic $Si_{1-x}Ge_x$ layer 6 is formed using an ultra-high-vacuum chemical vapor deposition (UHV-CVD) process. The $Si_{1-x}Ge_x$ layer thickness exceeds the critical thickness for misfit dislocation formation by glide of a pre-existing threading dislocation first proposed by J. W. Matthews, et al. J. Cryst. Growth 27, 188 (1974). This critical thickness decreases with increasing Ge mole fraction x.

In some embodiments of the present invention, the nearly pseudomorphic $Si_{1-x}Ge_x$ layer 6 has a uniform composition with a Ge fraction x in the range from about 0.01 to about 1, or a graded composition with the Ge fraction x increasing from 0, at the interface with the top crystalline surface, to higher x values in the range from about 0.01 to about 1 at the top surface of the pseudomorphic layer. In yet another embodiment of the present invention, the nearly pseudomorphic $Si_{1-x}Ge_x$ layer 6 can be subjected to a chemical mechanical polishing (CMP) step so as to provide a surface roughness in the range from about 0.1 nm to about 1 nm.

Next, ions of He or other like light elements are implanted through pseudomorphic $Si_{1-x}Ge_x$ layer 6 into substrate 5 below $Si_{1-x}Ge_x$ interface 7. Although the implanted ion may be implanted to any depth into substrate 5, a good value for the projected range of the implanted ions is from about 90 to about 300 nm, preferably about 110 to about 200 nm below interface 7. As shown in FIG. 1B, the implanted ions form damaged region 9 within substrate 5. It is noted that the implanted atoms are essentially concentrated in substrate 5, far below the single crystalline surface so that a minimum amount of implanted atoms is contained in the epitaxial layer and at interface 7.

Finally, and as shown in FIG. 1C, the implanted substrate is annealed at temperatures above 650° C. such that platelets are formed at a depth of about 100 to about 200 nm below $Si/Si_{1-x}Ge_x$ interface 7. In FIG. 1C, reference numeral 13 denotes the relaxed single crystalline $Si_{1-x}Ge_x$ layer formed during the annealing step. The high strain in the region of the platelets results in the nucleation of dislocation half loops (11) at the platelets. The half loops glide to the $Si/Si_{1-x}Ge_x$ interface where long misfit dislocation segments that relieve the lattice mismatch strain in the SiGe layer are formed. The density of misfit dislocation segments is large enough that 30%–80% of the lattice mismatch strain is relieved for layers as thin as 50–300 nm, respectively.

The inventive process produces a thin (less than 300 nm) partially relaxed, single crystalline SiGe buffer layer on bulk Si or an SOI substrate with a very low-threading dislocation density, e.g., $10^5$ cm$^{-2}$ for $Si_{0.85}Ge_{0.15}$ and less than $10^6$ cm$^{-2}$ for $Si_{0.80}Ge_{0.20}$, and a high degree of surface smoothness. The commonly used strain relaxed graded SiGe buffer layers of comparable alloy composition have 1–2 orders of magnitude higher threading dislocation densities (at least on larger wafers such as 5" or 8" diameter), a surface roughness larger by at least a factor of 10 and total layer thickness larger by at least a factor of 10 as well. FIGS. 2 and 3 show a direct comparison of the layer thickness and the surface roughness.

Figure 2A:
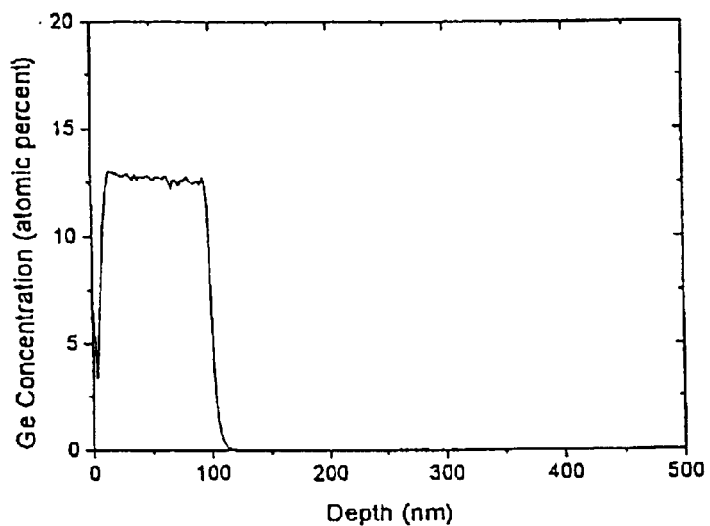
FIG. 2A illustrates the SIMS measurements of the Ge mole fraction vs. distance from the wafer surface for a relaxed ion-implanted nominally $Si_{0.85}Ge_{0.15}$ buffer layer grown on a bulk Si substrate.
Figure 2B:
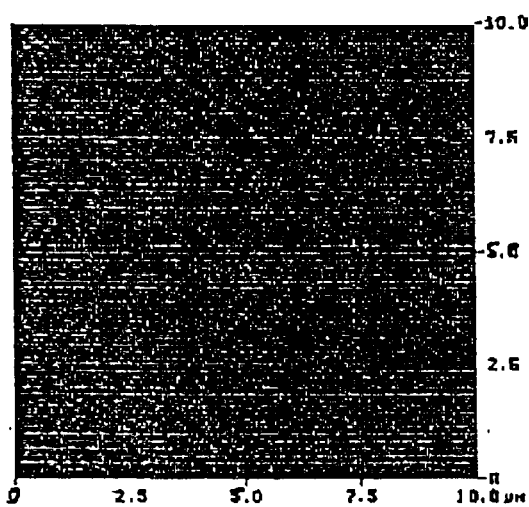
FIG. 2B is an atomic force micrograph (10 $\mu$m×10 $\mu$m) showing a faint cross hatch pattern on the surface of a relaxed ion-implanted $Si_{0.85}Ge_{0.15}$ buffer layer on a bulk Si substrate. The Z-range for the whole image is about 3 nm. The RMS roughness is about 0.28 nm. Layer thickness is about 100 nm; He implant dose $8\times10^{15}$ cm$^{-2}$; and annealed at 850° C. for 1 hr.
Figure 3A:
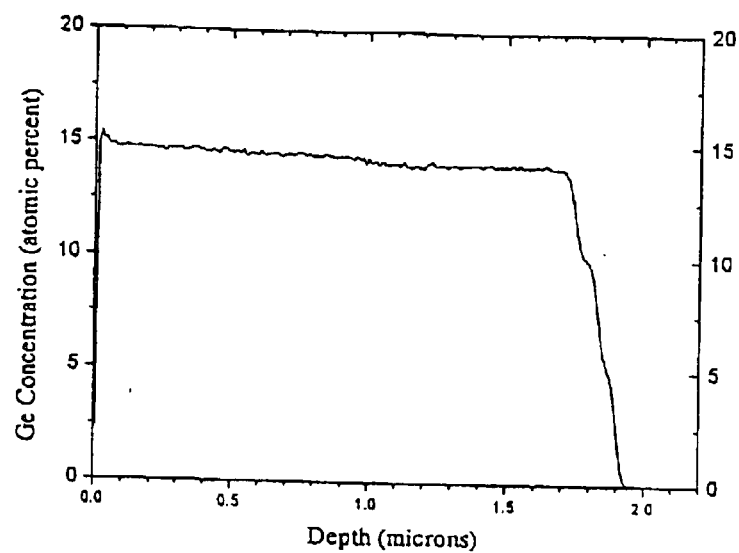
FIG. 3A (Prior Art) shows the SIMS measurements of the Ge mole fraction vs. distance from the wafer surface for a step-graded relaxed $Si_{0.85}Ge_{0.15}$ layer grown on a bulk Si substrate.
Figure 3B:
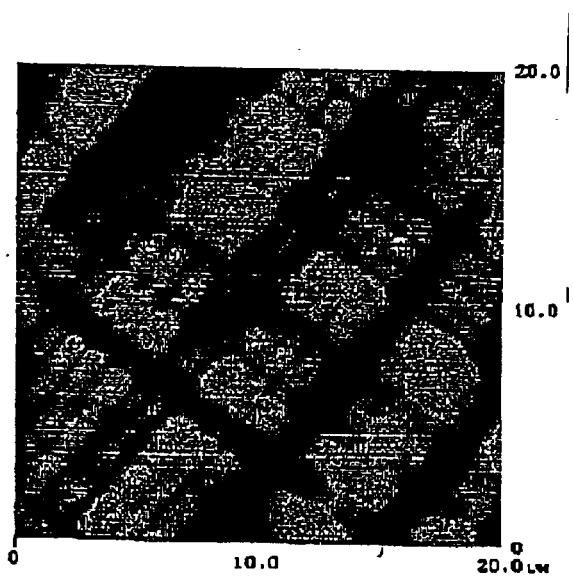
FIG. 3B (Prior Art) is an atomic force micrograph (20 $\mu$m×20 $\mu$m) showing a pronounced cross hatch pattern on the step-graded relaxed $Si_{0.85}Ge_{0.15}$ layer. The Z-range for the whole image is about 40 nm. The RMS roughness is about 6 nm.

Specifically, FIG. 2A shows a secondary ion mass spectroscopy (SIMS) profile that indicates the Ge composition variation as a function of the distance from the wafer surface; FIG. 2B shows the surface roughness as measured by atomic force microscopy (AFM); FIGS. 3A–B show the same types of data for a step-graded $Si_{0.85}Ge_{0.15}$ layer.

The important requirements to obtain the low-threading dislocation density and smooth surface in thin (<300 nm) SiGe buffer layers are:

a) Growth of a thin (less than 300 nm) pseudomorphic $Si_{1-x}Ge_x$ layer under conditions such that no strain relaxation occurs during the growth. This requires a method, such as UHV-CVD for example, where the initial wafer surface is extremely clean and the growth temperature is low (less than 550° C.). Other suitable growth methods that can be employed in the present invention include: molecular beam epitaxy (MBE), chemical beam epitaxy (CBE), chemical vapor deposition (CVD), plasma-enhanced chemical vapor deposition (PECVD) and ion-assisted deposition. The strained SiGe layer is metastable, i.e., the layer exceeds the critical thickness for strain relaxation but no defects are nucleated during the layer growth.

b) The formation of a highly defective layer, i.e., damaged region 9, at a depth of greater than 100 nm below the $Si/Si_{1-x}Ge_x$ interface by ion implantation of He or other like light element at a dose in the range from about $5 \times 10^{15}$ to about $15 \times 10^{15}$ cm$^{-2}$. Strain relaxation occurs during subsequent annealing (e.g., at about 850° C. for about 1 hr. or equivalent rapid thermal anneal).

Having an ideal pseudomorphic SiGe layer in step (a) is key to achieve a low threading dislocation density in the final structure. The high degree of interfacial cleanliness and low growth temperature are key to avoiding any strain relaxation by the usual dislocation nucleation mechanism at the $Si/Si_{1-x}Ge_x$ interface and the related dislocation multiplication that gives rise to dislocation pileups during the layer growth. As long as no dislocation multiplication occurs, the relaxation is exclusively governed by individual dislocations nucleated at platelets. However, if dislocation pileups are formed either, during the growth of the SiGe layer, or during annealing, the threading dislocation density will be higher and the surface will be rough.

The thin pseudomorphic $Si_{1-x}Ge_x$ layer combined with a relatively large He implant depth are important since they do not result in a strong accumulation of He within the pseudomorphic layer and, more importantly, at the layer substrate interface. This accumulation is observed for the implant doses and conditions reported previously using prior art ion implantation conditions. The accumulation of He gives rise to He bubbles close to the $Si/Si_{1-x}Ge_x$ interface, each of which gives rise to at least one threading dislocation extending from the He-induced bubble to the wafer surface. In contrast, applicants have found ion implantation conditions different from those reported in the literature that result in strain relaxation by a mechanism that is completely different from both the bubble mechanism previously reported for He implanted wafers and also the strain relaxation mechanism operative for graded buffer layer growth.

Figure 4A:
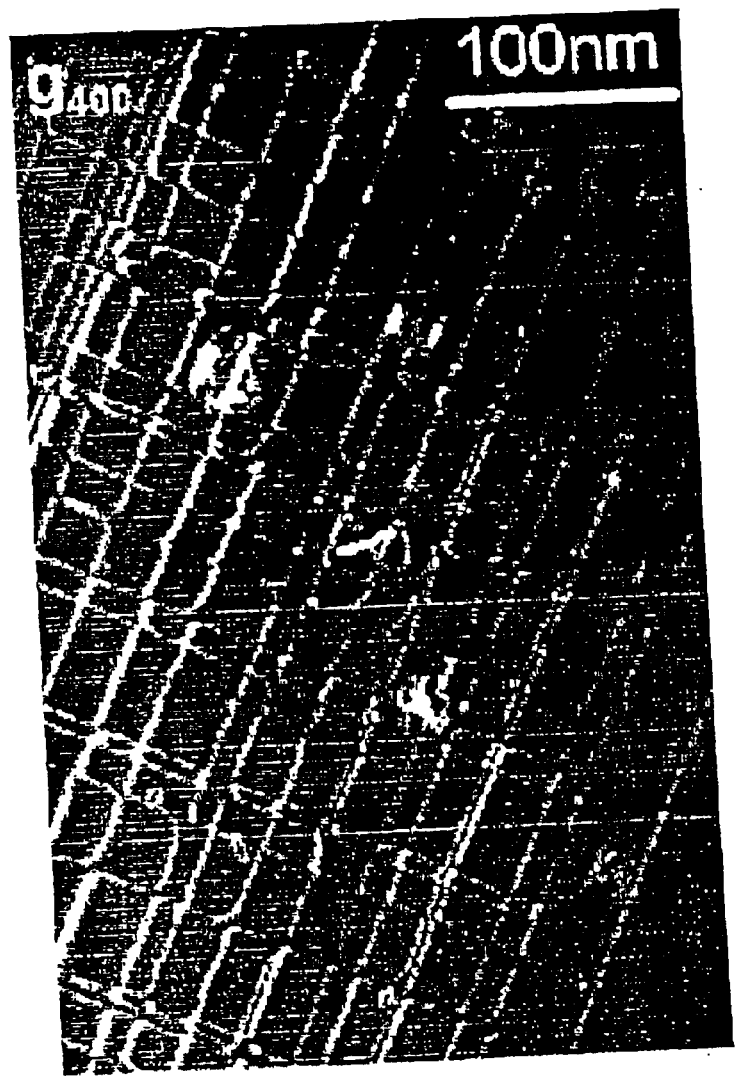
FIG. 4A is a planar view TEM micrograph (weak beam ($g_{400}$), two beam conditions) of a relaxed ion implanted buffer layer. White round structures stem from the platelets that reside below the Si/Si$_{1-x}$Ge$_x$ interface. Orthogonal white lines along <110> directions indicate 60° misfit dislocations that reside at, or close to the Si/Si$_{1-x}$Ge$_x$ interface. He-implant; layer thickness is about 100 nm; implant dose $1\times10^{16}$ cm$^{-2}$; and anneal 850° C., 1 hr.
Figure 4B:
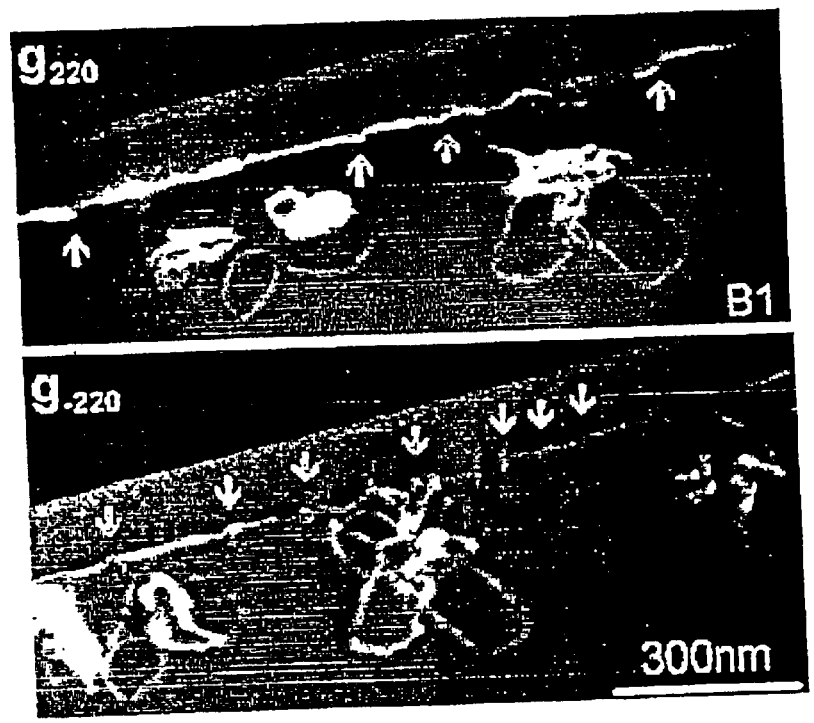
FIG. 4B is a cross-sectional TEM micrograph (weak beam, two beam conditions) of an ion implanted buffer layer. Under dark field conditions dislocations and He-induced platelets (or a width of about 100–150 nm and a spacing of that order) appear bright.

The new very effective strain relaxation mechanism occurring in the present invention is dislocation nucleation at He-induced platelets (not bubbles) that lie parallel to the Si (001) surface, as shown in FIG. 4A, in a planar view transmission electron micrograph (PVTEM), and in FIG. 4B, in a cross sectional transmission electron micrograph (XTEM). The platelets can be as wide as 150 nm and eject dislocation half loops in the eight possible <110> directions. The dislocation half loops having the right orientation extend to the interface where they deposit a misfit segment and where this misfit segment extends and relieves strain in the SiGe layer. The length of a misfit segment can be as long as several 10s of a μm so that the actual platelet spacing can be comparatively large (c.f. FIGS. 4A–B) and nevertheless result in a high degree of relaxation. The tremendous reduction of the threading dislocation density is a result of the nature of the platelets that act as intentionally inserted sources for dislocation nucleation. In graded buffer layers there is no control over the density and distribution of sources for dislocation nucleation. Thus, an irregular array of dislocations result in very uneven strain distribution in the relaxed SiGe layer, a very rough surface and regions of high and low threading dislocation densities. In the case of a high implant dose or low implant depth, a bubble rather than a platelet regime is entered. These bubble regimes are undesirable since they result in higher threading dislocation densities.

Figure 5A:
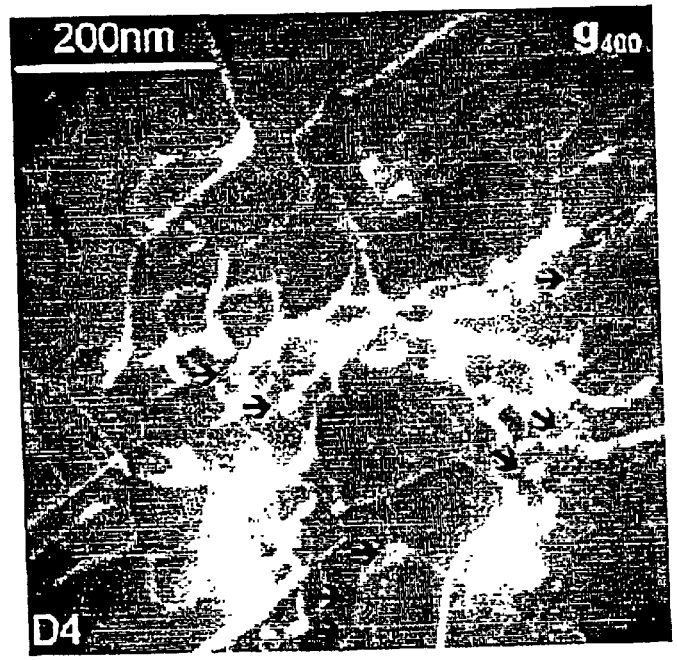
FIG. 5A (Prior Art) is a planar view TEM micrograph (weak beam, two beam conditions) of an ion implanted buffer layer fabricated with a very high implant dose ($2\times10^{16}$ cm$^{-2}$). Under dark field conditions dislocations and He induced bubbles (with a diameter of about 20–30 nm) appear bright.
Figure 5B:
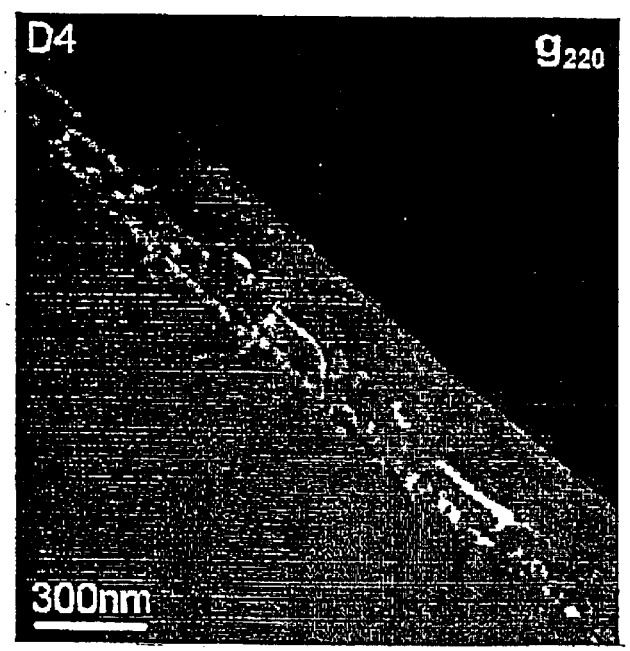
FIG. 5B (Prior Art) is a cross-sectional TEM micrograph (weak beam, two beam conditions) of an ion implanted buffer layer with a very high implantation dose. Under dark field conditions dislocations and He induced bubbles appear bright.

Bubbles that are induced using higher implant doses are shown in FIGS. 5A–B (Prior Art). The bubbles form at the $Si_{1-x}Ge_x$ interface at higher implant doses when the projected range of the implanted species is too close to the $Si/Si_{1-x}Ge_x$ interface. The bubbles that reside at or close to the interface foster dislocation half loop nucleation due to their strain fields. The half loops are pushed from the bubbles to the layer surface, attracted by image forces as explained previously in H. Trinkaus, et al., Appl. Phys. Lett. 76, 3552 (2000) and M. Luysberg, et al., Microscopy on Semiconducting Materials, IOP Publishing, Oxford 2001, and thereby create a high threading dislocation density.

Bubbles that are induced by shallower implant are also undesirable. They are much smaller (only up to several 10s of nm) than the platelets and form at a much higher density and thus there is a much smaller average spacing between them as shown in the TEM micrographs in FIGS. 5A–B. This high bubble density creates a high density of dislocation nucleation sources in the SiGe layer resulting again in a high threading dislocation density. Thus, the platelet regime is the one that has to be met to obtain the lowest threading dislocation density.

At higher values of the Ge mole fraction (x greater than 0.25) it is difficult to grow a strictly pseudomorphic $Si_{1-x}Ge_x$ layer due to the higher lattice mismatch strain, which induces surface roughening or islanding. Therefore, to achieve relaxed buffer layers having a higher Ge mole fraction, it may be necessary to first fabricate a relaxed $Si_{1-x}Ge_x$ layer with x less than 0.25 by the method proposed above and subsequently grow a second pseudomorphic $Si_{1-x}Ge_x$ with higher x, implant He below the upper $Si_{1-x}Ge_x$ layer and then anneal again to relax the upper $Si_{1-x}Ge_x$ layer. This process can be repeated several times, increasing the Ge mole fraction of each successive layer, to achieve a relaxed Ge layer.

Dislocation nucleation is expected to occur by a similar platelet mechanism when other light elements such as H (hydrogen), D (deuterium), B (boron), or N (nitrogen) are implanted, or when a combination of elements such as H+B and He+B are implanted. The same element can be implanted at different depths using different implant energies. Combinations of different elements can be implanted at the same or at different depths by selecting suitable energies. This method of fabricating a relaxed SiGe buffer layer can also be applied to patterned Si or SOI substrates or to selected regions on blanket substrates.

Surprisingly, it has been determined that >70% strain relaxation of a thin (about 200 nm) pseudomorphic $Si_{1-x}Ge_x$ layer occurs by a platelet mechanism after ion implantation with relatively low doses of He and subsequent thermal annealing. This mechanism occurs when the projected range of the implanted species is greater than 100 nm below the $Si/Si_{1-x}Ge_x$ interface. The thin SiGe layers fabricated by the inventive process are of very high quality, with smooth surfaces (RMS roughness less than 1 nm) and threading dislocation densities <$10^6$ cm$^{-2}$. This unexpected and efficient strain relaxation mechanism is distinctly different from the bubble mechanism that occurs when the projected range of the implanted species is less than 100 nm from the interface (conditions that have been reported in the literature, e.g. in H. Trinkaus, et al., Appl. Phys. Lett. 76, 3552 (2000) and M. Luysberg, et al., Microscopy on Semiconducting Materials, IOP Publishing, Oxford 2001). The inventive method of achieving a strain relaxed SiGe buffer layer is also completely different from the graded buffer layers that are now commonly used as "virtual substrates" for a variety of devices.

The strain relaxed $Si_{1-x}Ge_x$ buffer layers fabricated by the inventive process can be used as "virtual substrates" for a wide variety of silicon-based devices including field effect transistors (FETs) of various types including strained silicon CMOS devices and modulationdoped field effect transistors (MODFETs). These buffer layers can also be used as "virtual substrates" for various types of superlattices for many different applications.

The present invention discloses several methods for fabricating a strain relaxed epitaxial layer on a single crystalline surface with a mismatched lattice parameter and semiconductor structures that can be built on such a relaxed layer. More specifically, the present invention discloses methods for fabricating a partially strain relaxed SiGe, i.e, $Si_{1-x}Ge_x$ buffer layer for application as a "virtual substrate" for a variety of semiconductor devices having a strained Si or SiGe layer as the active region of the device.

Figure 6:
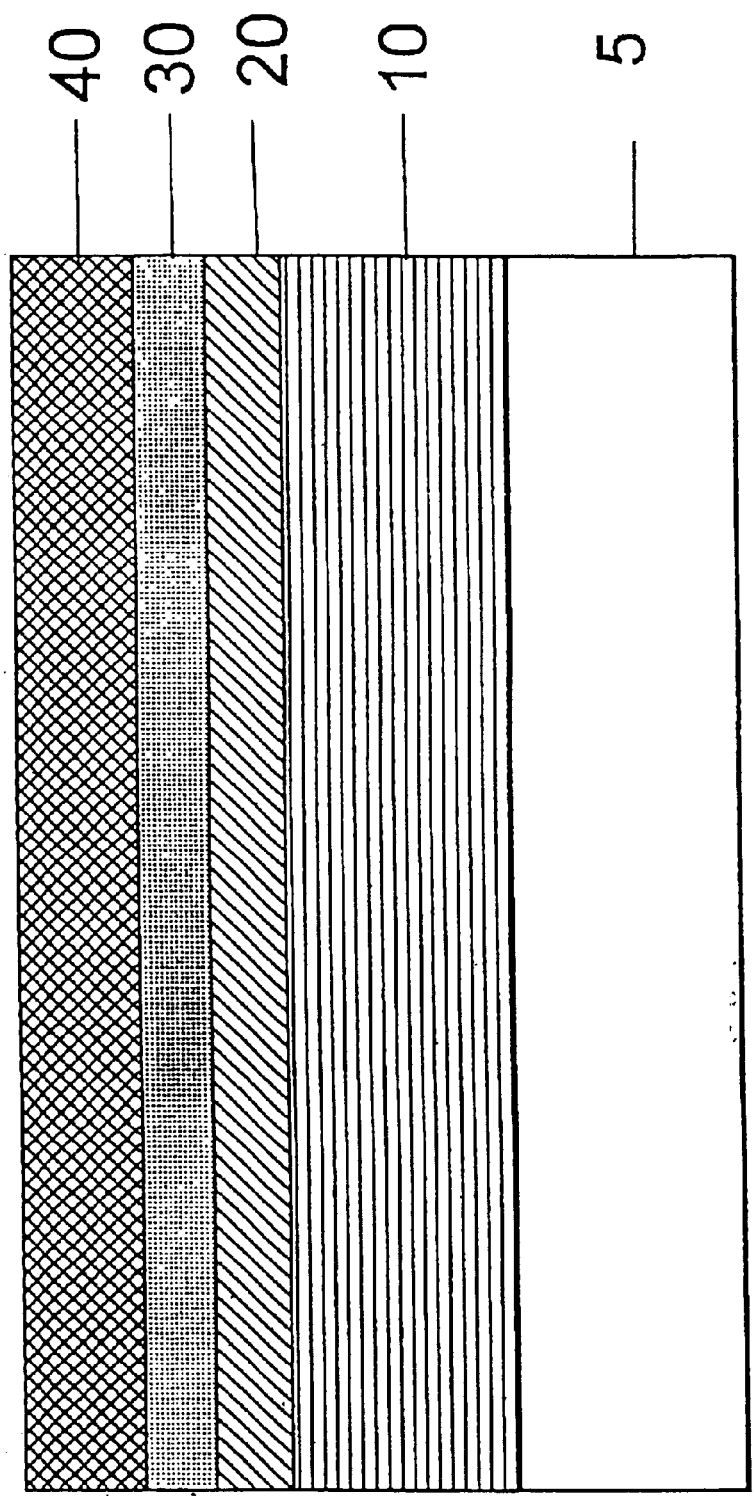
FIG. 6 is a cross section of an inventive structure containing the relaxed buffer layer fabricated by the process of the present invention.

According to one embodiment of the present invention and referring to FIG. 6, a thin, strictly pseudomorphic $Si_{1-x}Ge_x$ layer 40 is grown epitaxially on a substrate having a single crystalline surface. The pseudomorphic layer is grown in a clean environment using a method such as ultra-high-vacuum chemical vapor deposition (UHV-CVD), MBE, PECVD, ion-assisted deposition or chemical beam epitaxy. In some embodiments, the $Si_{1-x}Ge_x$ layer may include C therein.

The substrate 5 in FIG. 6 can be, for example, bulk Si or SOI and the single crystalline surface is of a layer selected from the group comprising Si, $Si_{1-x}Ge_x$, Ge, $Si_{1-y}C_y$, $Si_{1-x-y}Ge_xC_y$ and it can be patterned or not. The $Si_{1-x}Ge_x$ layer thickness exceeds the critical thickness for misfit dislocation formation and due to the clean environment and a low growth temperature no dislocation nucleation occurs during the growth of this $Si_{1-x}Ge_x$ layer. Helium is then implanted through the pseudomorphic $Si_{1-x}Ge_x$ layer into the substrate below the $Si_{1-x}Ge_x$ Gex interface. The He ions are implanted at doses in the range of from about $4\times10^{15}$ to about $4\times10^{16}$ cm$^{-2}$, preferably in the range of from about $7\times10^{15}$ to about $12\times10^{15}$ cm$^{-2}$. The wafer surface can be masked prior to implantation so that the He is implanted only into certain regions of the wafer, not over the entire wafer area. The projected range of the implanted He is about 100 nm to about 300 nm below the interface. Alternatively, the implanted ions can be from the group comprising H, D, B, or N.

The implanted wafer is then annealed in a furnace at temperatures above 650° C. for at least 30 minutes. As a result of the annealing, platelet-like defects are formed in layer 20 of FIG. 6, which is part of original single crystalline surface layer 10. The platelets in layer 20, which has a thickness of from about 20 nm to about 300 nm, give rise to dislocation nucleation. Layer 30, which is also part of original single crystalline surface layer 10, contains dislocations that thread to the interface with layer 40 where they form misfit segments. Layer 40 is between 50 nm and 500 nm thick (depending on the alloy composition), preferably about 100 nm. Moreover, layer 40 contains between 5 and 35 atomic % Ge and has a smooth surface (RMS roughness less than 1 nm) and a threading dislocation (TD) density of less than $10^6$ cm$^{-2}$.

Figure 7:
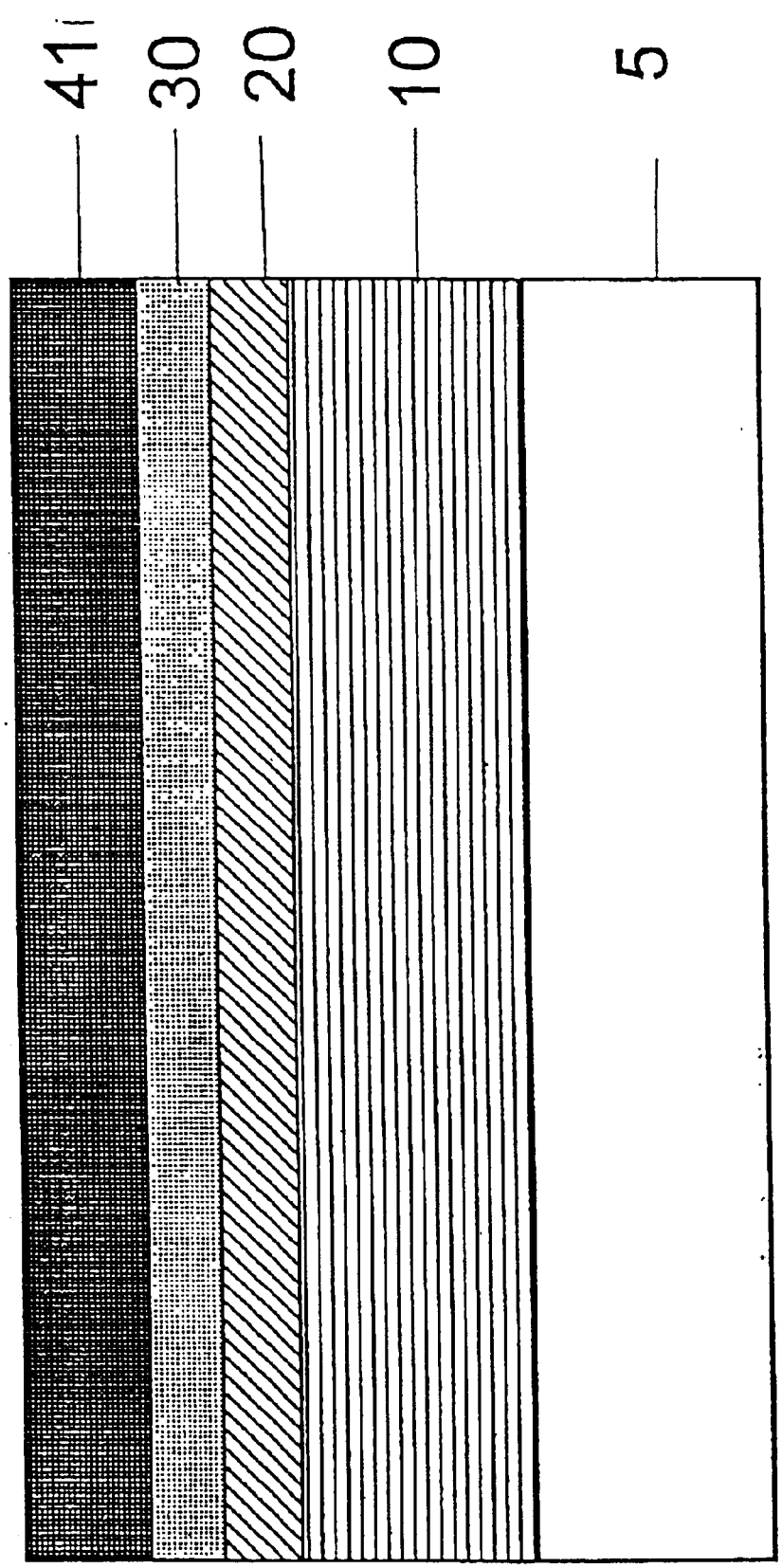
FIG. 7 is a schematic view of the cross section of the structure of FIG. 6 containing an optional graded composition SiGe layer 41 instead of the original uniform composition layer 40 of FIG. 6.

In a second embodiment of the present invention, the procedure is similar to the one described in the first embodiment, except that the $Si_{1-x}Ge_x$ layer 40 in FIG. 6 is replaced in FIG. 7 by layer 41 which has a graded alloy composition with x=0 at the bottom and 0<x<1.0 at the top of the layer. The composition of the graded layer 41 can change linearly or stepwise.

In a third embodiment of the present invention, the procedure is the same as described in the first two embodiments except that two different atomic species are implanted at the same or different depths from the $Si/Si_{1-x}Ge_x$ interface.

In a fourth embodiment of the present invention, the procedure is the same as described in the first two embodiments except that the same atomic species is implanted at two different depths from the $Si/Si_{1-x}Ge_x$ interface.

In a fifth embodiment of the present invention, a thin (50–300 nm), strictly pseudomorphic $Si_{1-y}C_y$ layer, where y is as large as 0.02, is grown epitaxially on a substrate having a single crystalline surface layer. The substrate can be, for example, bulk Si or SOI, having a single crystalline surface from the group comprising Si, $Si_{1-x}Ge_x$, Ge, $Si_{1-x-y}Ge_xC_y$. A 50–300 nm thick strictly pseudomorphic crystalline Si layer is then grown on top of the $Si_{1-y}C_y$ layer followed by a strictly pseudomorphic $Si_{1-x}Ge_x$ layer. All the pseudomorphic crystalline layers are grown in a clean environment using a method such as ultra-high-vacuum chemical vapor deposition (UHV-CVD), MBE, PECVD, ion assisted deposition or chemical beam epitaxy. The $Si_{1-x}Ge_x$ layer thickness exceeds the critical thickness for misfit dislocation formation and due to the clean environment and a low growth temperature no dislocation nucleation occurs during the growth of this $Si_{1-x}Ge_x$ layer. The wafer is then annealed in a furnace at temperatures above 750° C. for at least 30 min. During annealing, defects formed in the carbon containing layer act as nucleation sources for dislocations which thread to the $Si/Si_{1-x}Ge_x$ interface and form misfit dislocations that relieve the strain in the $Si_{1-x}Ge_x$ layer. When present, the carbon containing epitaxial layer has a thickness between 20 nm and 110 nm and a C content in the range from $1\times10^{19}$ to $2\times10^{21}$ cm$^{-3}$. In some embodiments of the present invention, the variable y is greater than x, or y=x or y<x. In another embodiment, the subsequent nearly pseudomorphic $Si_{1-y}Ge_y$ layers have a graded composition with the Ge fraction y changing from that equal to the value at the top of the precedent pseudomorphic layer, to higher y values in the range of from about 0.01 to about 1 at the top surface of the subsequent layers. In yet another embodiment, the subsequent nearly pseudomorphic $Si_{1-y}Ge_y$ layer has a graded composition whereby the Ge fraction y is initially equal to the value at the top of the precedent nearly pseudomorphic layer and then increased in a linear manner to higher y values in the range of from about 0.01 to about 1 at the upper surface of the subsequent nearly pseudomorphic layer.

Figure 8:
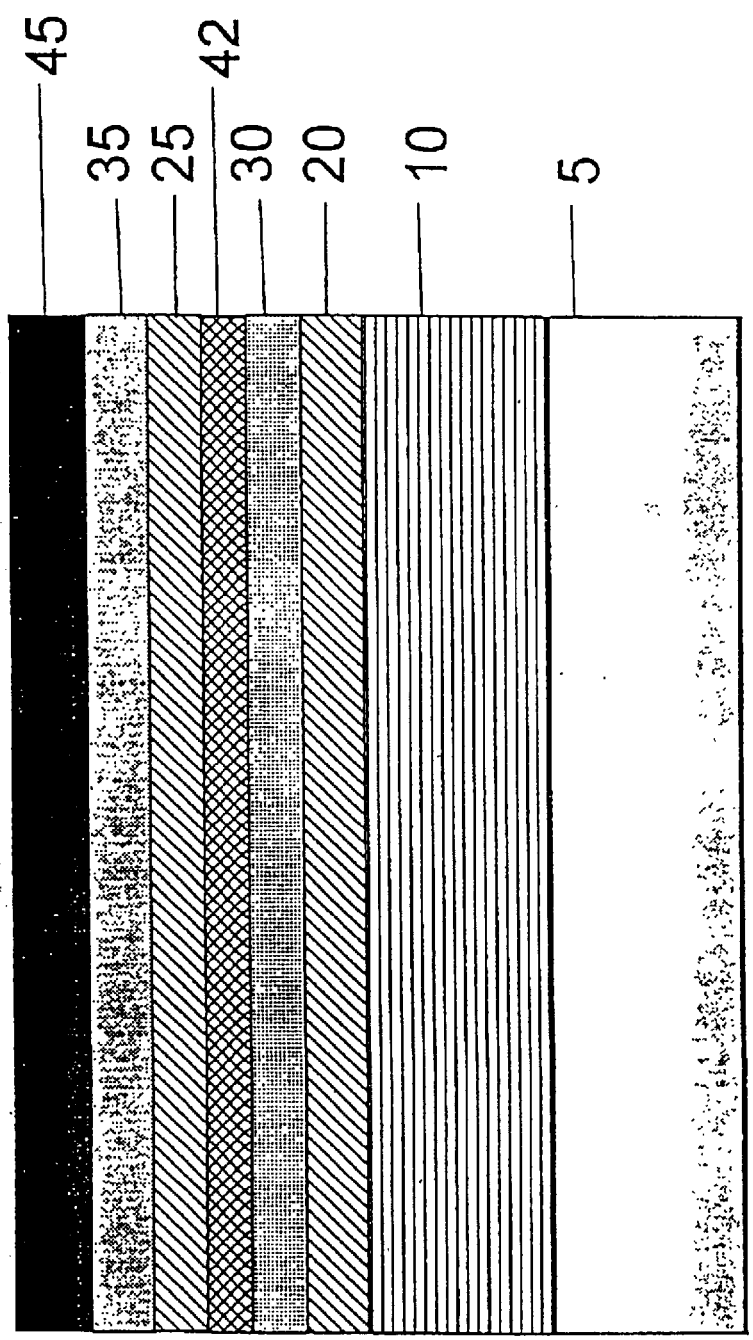
FIG. 8 shows a cross section of an inventive structure containing the relaxed buffer layer fabricated by performing the inventive three-step procedure twice.

In a sixth embodiment of the present invention, the relaxed SiGe buffer layer is fabricated by performing the steps described in the first and second embodiments at least twice, implanting either one or more atomic species as described in the third and fourth embodiments. This procedure may be necessary in order to achieve relaxed $Si_{1-x}Ge_x$ buffer layers with x is greater than 0.25. The $Si_{1-x}Ge_x$ layer may have a uniform alloy composition or a graded alloy composition. Referring to FIG. 8, layers 5, 10, 20 and 30 are the same as in FIG. 6. Layers 42, 25 and 35 together comprise layer 40 of FIG. 6 (i.e., the first relaxed SiGe layer) and therefore all have the same Ge content, which is between 5 and 35 atomic % Ge, and has a smooth surface (RMS is less than 1 nm) and a threading dislocation (TD) density less than $10^6$ cm$^{-2}$. Layer 25 contains the second implant damage region with a thickness of about 150 nm containing platelets that give rise to dislocation nucleation. Layer 35, like layer 30, contains dislocations that thread to the interface to layer 45 where they form misfit segments. Layer 45 is the second relaxed uniform composition SiGe layer which has a larger atomic percent of Ge than layers 42, 25 and 35 and is between 50 nm and 500 nm thick.

Figure 9:
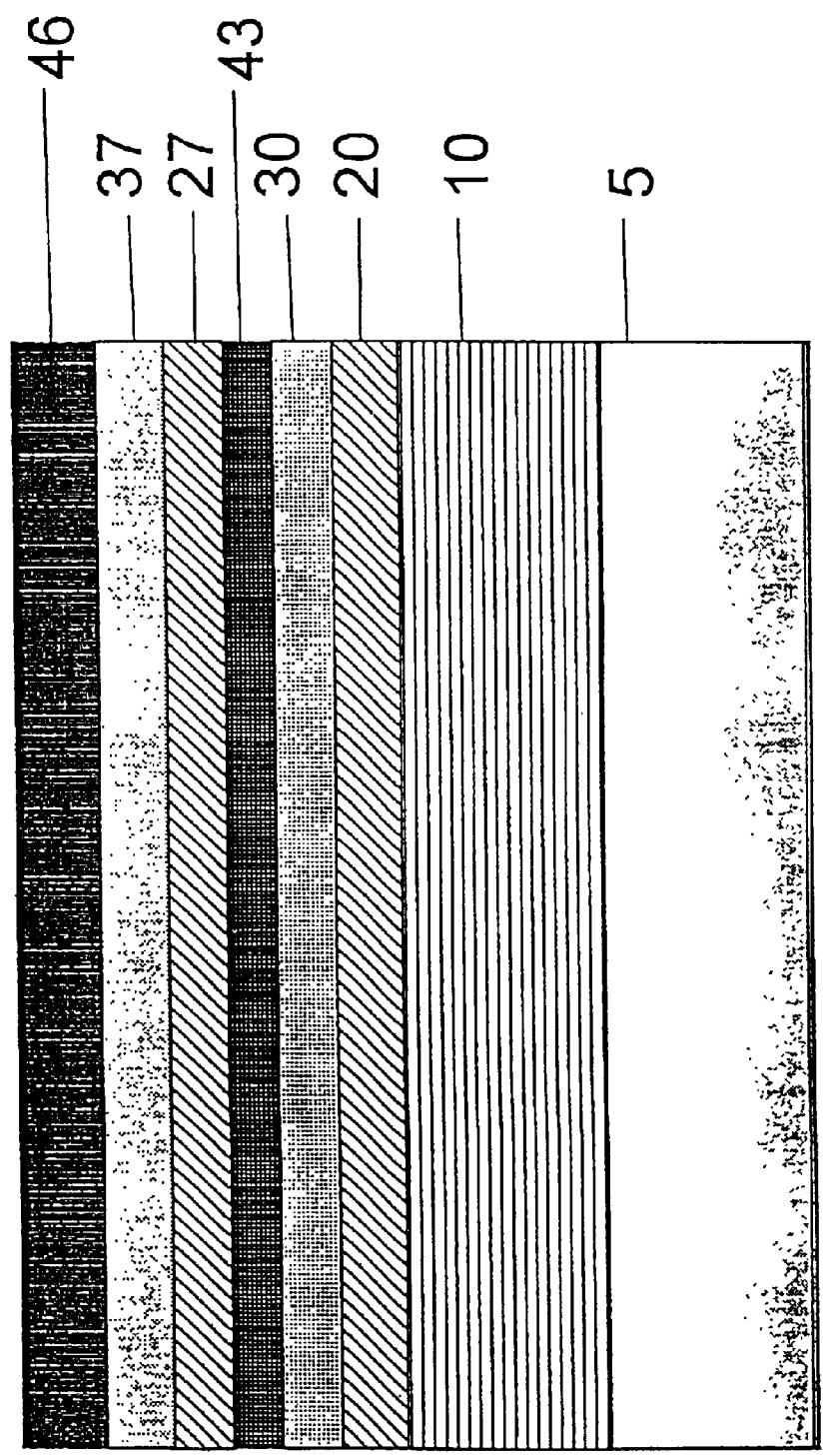
FIG. 9 is a schematic view of the cross section of the structure of FIG. 8 except that SiGe layers 43, 27 and 37 (original layer 41 of FIG. 7) and layer 46 have a graded alloy composition.

Referring to FIG. 9, layers 43, 27 and 37 correspond to the original layer 41 of FIG. 7 which has a graded alloy composition with x=0 at the bottom and 0<x<1.0 at the top of the layer. The bottom of layer 46 has a composition equal to that of the top of layer 37 and the top of layer 46 has a greater alloy composition (up to x=1.0). The composition of the graded layer 46 can change linearly or stepwise.

Figure 10:
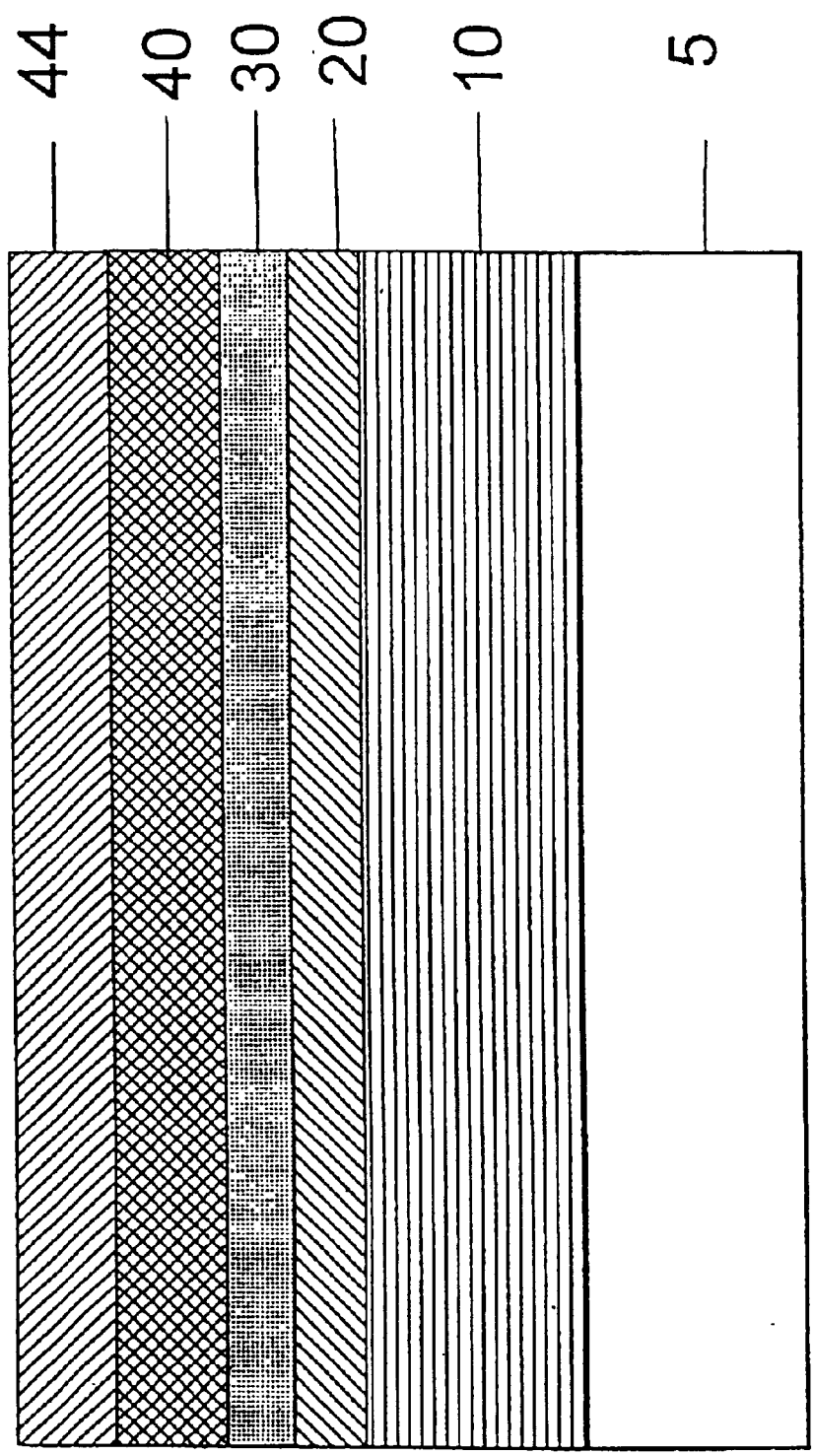
FIG. 10 is a schematic of the cross section of FIG. 6 where an additional single crystalline uniform composition SiGe layer 44 having a greater atomic % Ge is grown epitaxially on layer 40.
Figure 11:
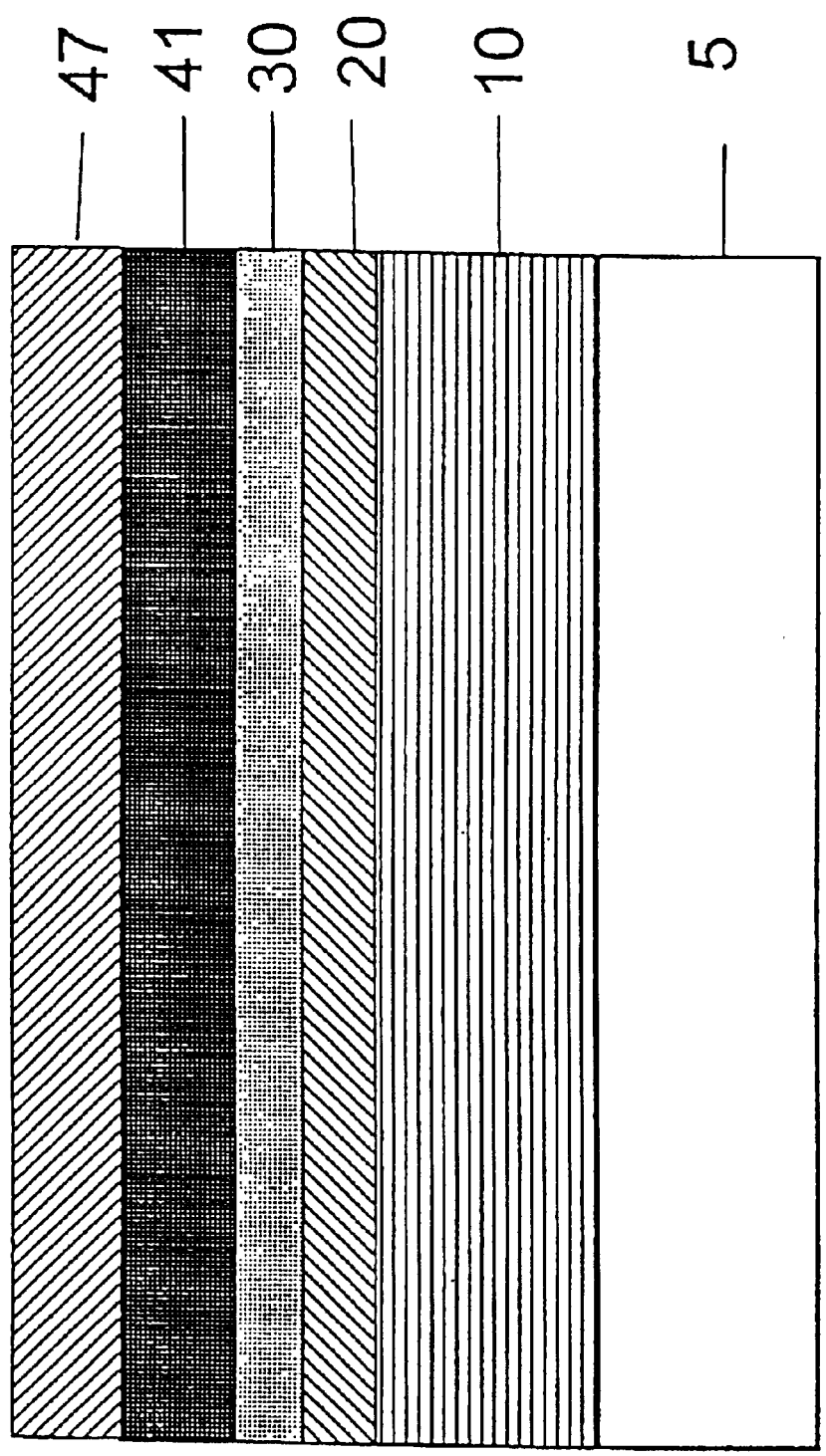
FIG. 11 is a schematic of the cross section of FIG. 7 where an additional single crystalline graded composition SiGe layer 47 having a greater atomic % Ge is grown epitaxially on top of layer 41.

A seventh embodiment is another variation of the method for fabricating a relaxed SiGe buffer layer in which a second $Si_{1-x}Ge_x$ layer of higher atomic % Ge is grown epitaxially on the relaxed buffer layer fabricated according to one of the procedures described in the first five embodiments and then subsequently annealed so that strain relaxation may occur. This is done in order to achieve relaxed SiGe layers that have an alloy composition greater than 0.25. Referring to FIG. 10, layer 44, which is grown epitaxially on top of layer 40 of FIG. 6, is between 50 and 500 nm thick, preferable between 100–200 nm and has Ge atomic % greater than layer 40, between 15 and 60%, preferably between 20 and 40%. In FIG. 11, layer 47, grown on top of layer 41 of FIG. 7, is between 50 and 500 nm thick, preferably from 100 to 200 nm, and has a graded composition with Ge atomic % at the bottom that is equal to that of the top of layer 41 and is higher (up to x=1.0) at the top of the layer. The composition of the graded layer 47 can change linearly or stepwise.

As mentioned before, the methods described for the preparation of strain relaxed SiGe buffer layers on a Si containing single crystalline surface can by applied in similar ways to fabricate strain relaxed epitaxial layers of different materials on single crystalline lattice mismatched surfaces.

The relaxed $Si_{1-x}Ge_x$ buffer layers fabricated by the methods described above may be used to fabricate SiGe-on-insulator substrates for integrated circuits using wafer bonding and layer transfer methods. These relaxed SiGe buffer layers may also be used as 'virtual substrates' for a variety of integrated circuits having at least one semiconductor device.

The structures obtained by the methods described above can be further expanded to fabricate more complex device structures. The device layer structures shown in FIGS. 12–17 are accordingly fabricated by growing additional epitaxial layers on the structures of FIGS. 6–11.

Figure 12:
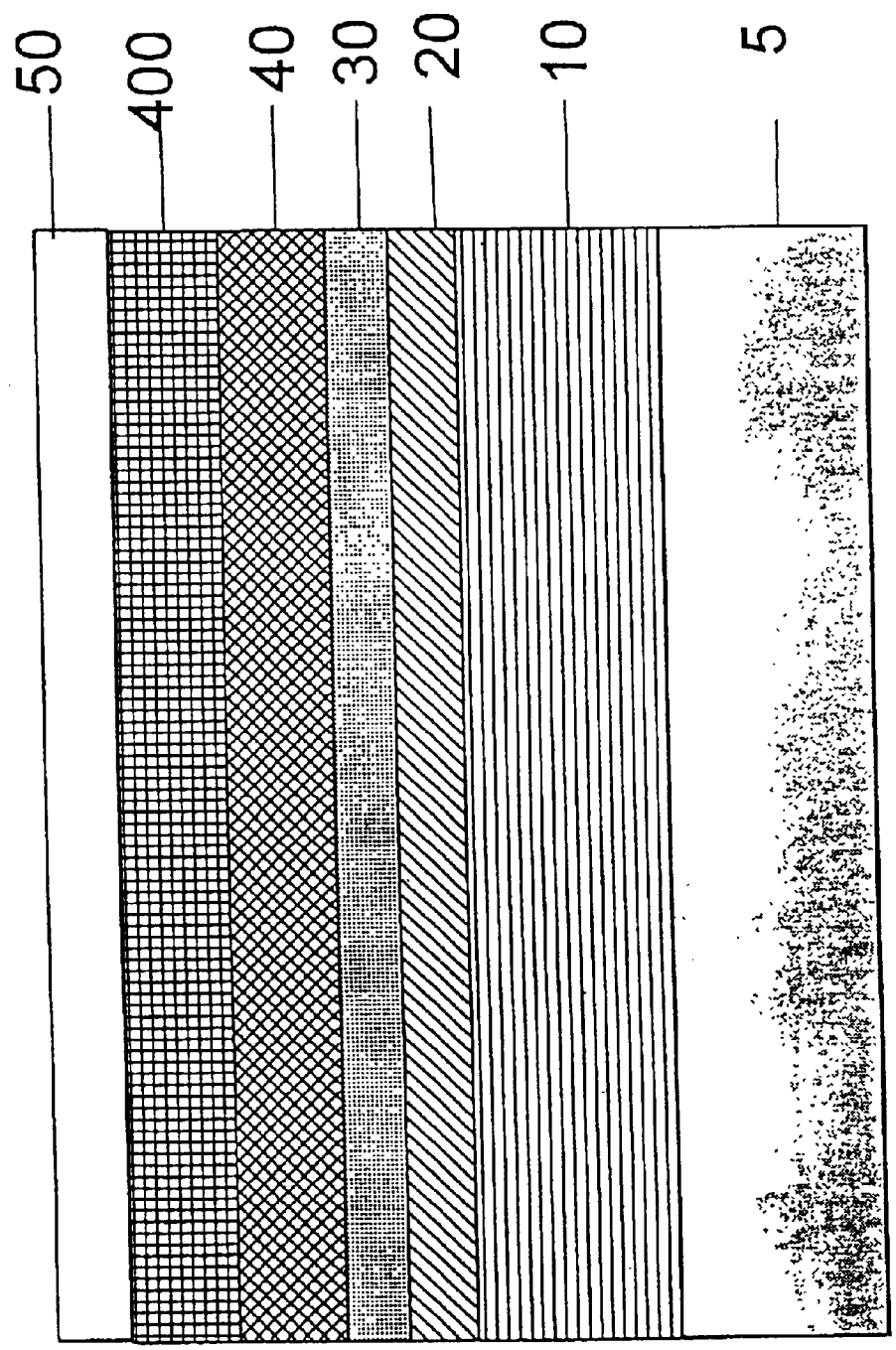
FIG. 12 is a schematic of the cross section of FIG. 6 where an additional single crystalline uniform composition SiGe layer 400 of identical composition to layer 40 is deposited homoepitaxially on layer 40 and a strained Si layer is deposited on top of layer 400.

In FIG. 12, layer 400 is a SiGe layer that has the same atomic % Ge as layer 40, thickness between 100 nm and 1000 nm, preferably between 300 nm and 500 nm, and the TD density is not higher than that of layer 40. Layer 50 is a strictly pseudomorphic strained Si layer with a thickness between 50 and 350 nm, preferably about 200 nm.

Figure 13:
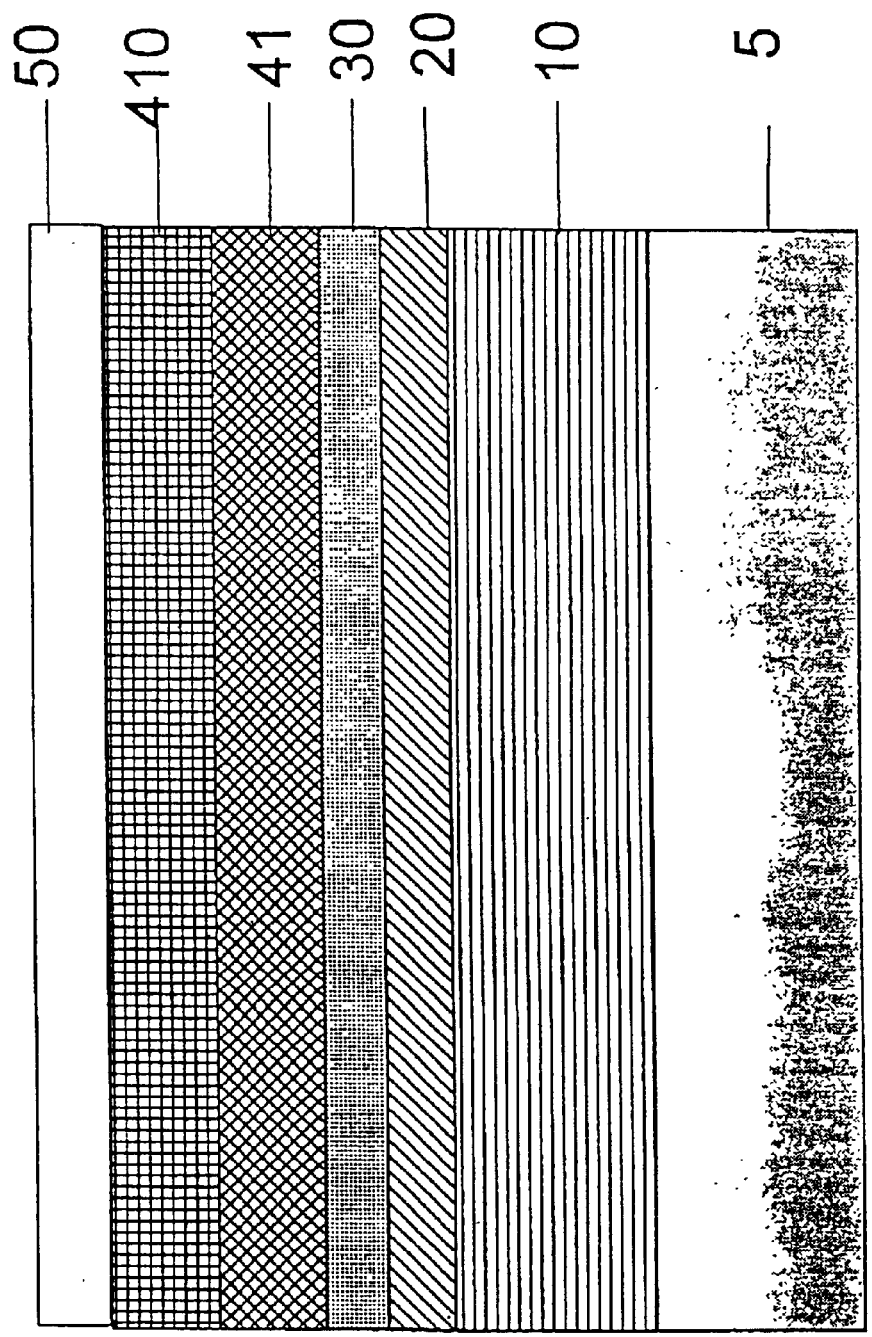
FIG. 13 is a schematic of the cross section of FIG. 7 where an additional single crystalline uniform composition SiGe layer 410 of identical composition as the top of layer 41 is deposited homoepitaxially on layer 41. A strained Si cap layer is deposited on layer 410.

In FIG. 13, layer 410 is a SiGe layer that has the same atomic % Ge as the top of layer 41. The thickness of layer 410 is between 100 nm and 1000 nm, preferably between 300 nm and 500 nm and the TD density is not higher than that of layer 41. Layer 50 is a strictly pseudomorphic strained Si layer with a thickness between 50 and 350 nm, preferably about 200 nm.

Figure 14:
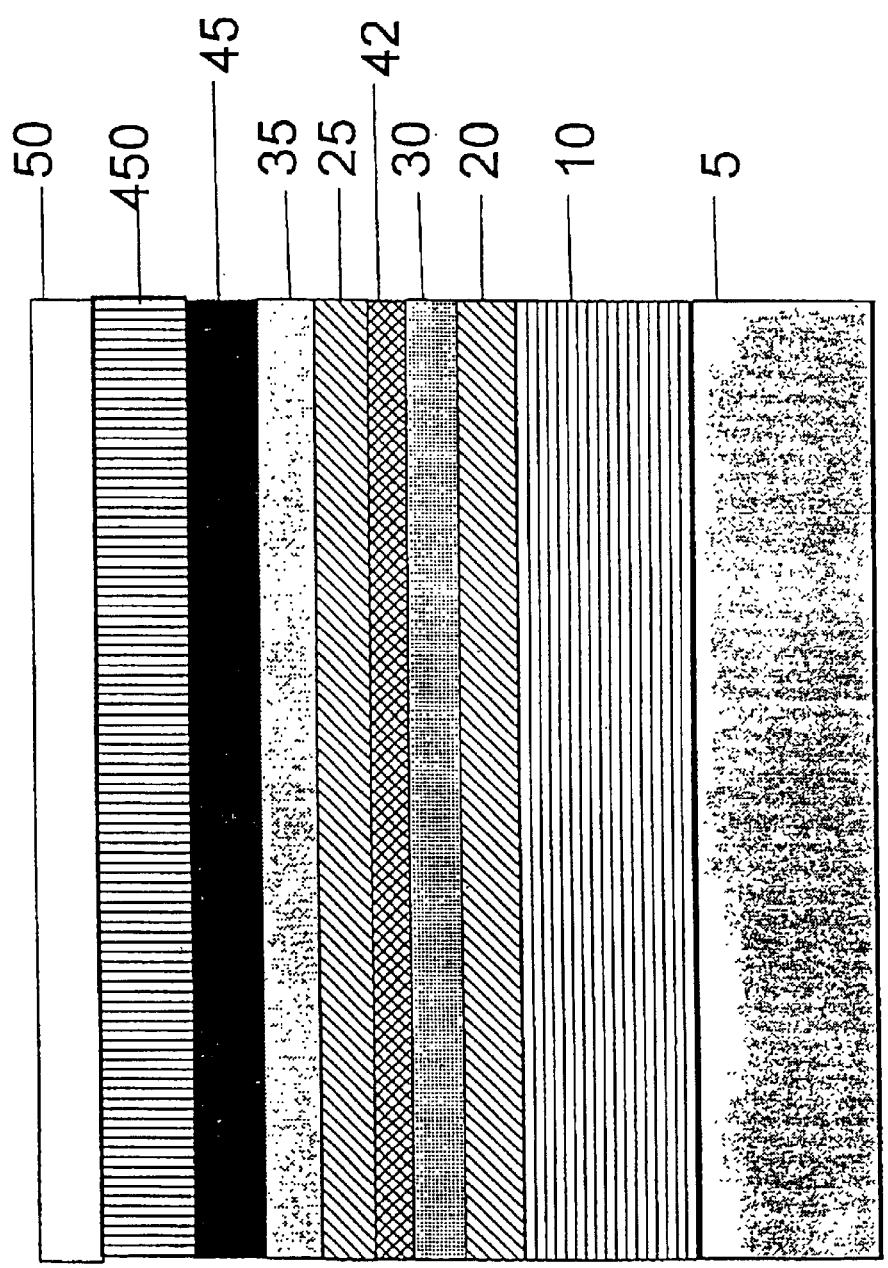
FIG. 14 is a schematic of the cross section of FIG. 8 where an additional single crystalline uniform composition SiGe layer 450 of identical composition to layer 45 is deposited homoepitaxially on layer 45. Additional strain relaxation may occur during the growth of this layer. A strained Si cap layer is deposited on layer 450.

In FIG. 14, layer 450 is a SiGe layer that has the same atomic % Ge as layer 45. The thickness of layer 450 is between 100 nm and 1000 nm, preferably between 300 nm and 500 nm and the threading dislocation density is not higher than that of layer 45. Layer 50 is a strictly pseudomorphic strained Si layer with a thickness between 50 and 350 nm, preferably about 200 nm.

Figure 15:
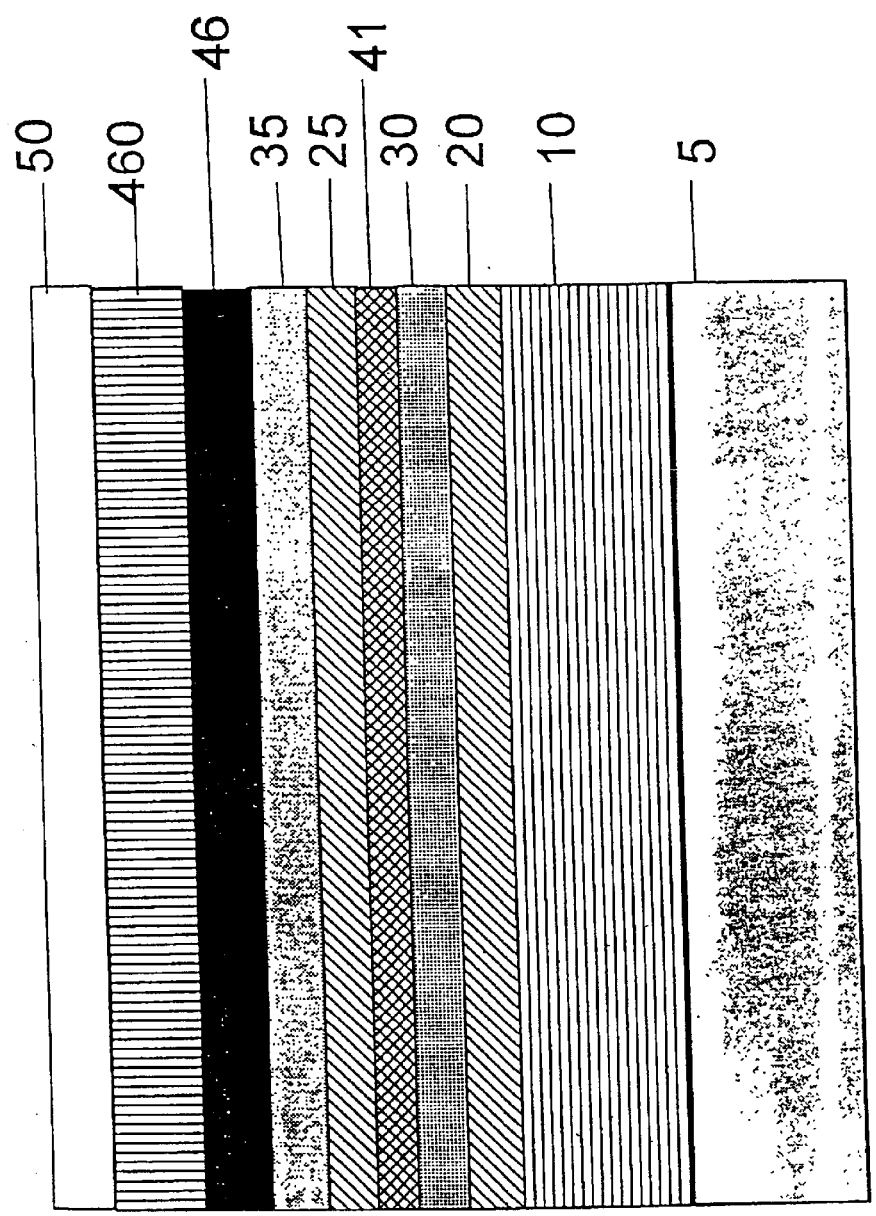
FIG. 15 is a schematic of the cross section of FIG. 9 where an additional single crystalline uniform composition SiGe layer 460 of identical composition as the top region of layer 46 is deposited homoepitaxially on layer 46. A strained Si cap layer 50 is deposited on top of layer 460.

In FIG. 15, layer 460 is a SiGe layer that has the same atomic % Ge as the top of layer 46. The thickness of layer 460 is between 100 nm and 1000 nm, preferably between 300 nm and 500 nm and the threading dislocation density is not higher than that of layer 46. Layer 50 is a strictly pseudomorphic strained Si layer with a thickness between 50 and 350 nm, preferably about 200 nm.

Figure 16:
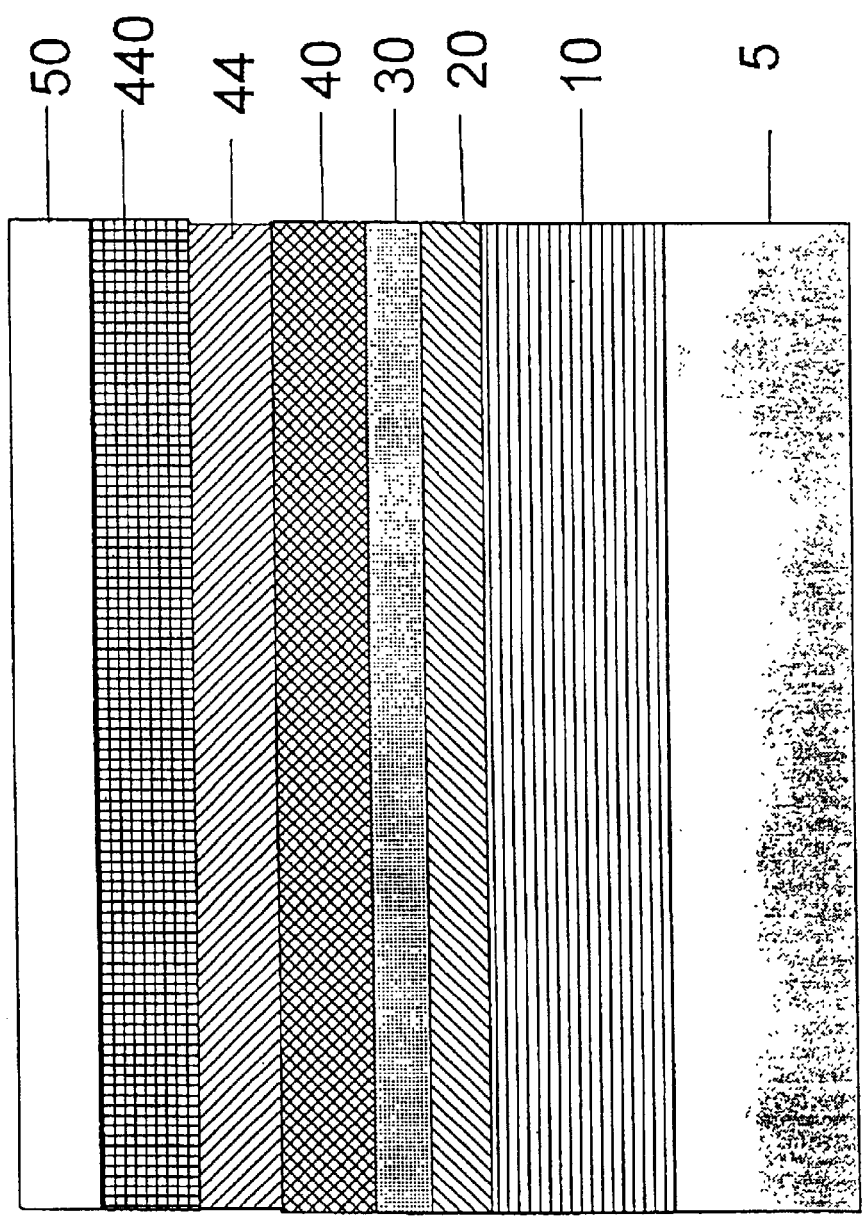
FIG. 16 is a schematic of FIG. 10 where an additional single crystalline uniform composition layer 440 of similar composition as layer 44 is deposited homoepitaxially on layer 44. A strained Si cap layer 50 is deposited on top of layer 440.

In FIG. 16, layer 440 is a SiGe layer that has the same atomic % Ge as the top of layer 44. The thickness of layer 440 is between 100 nm and 1000 nm, preferably between 300 nm and 500 nm and the threading dislocation density is not higher than that of layer 44. Layer 50 is a strictly pseudomorphic strained Si layer with a thickness between 50 and 350 nm, preferably about 200 nm.

Figure 17:
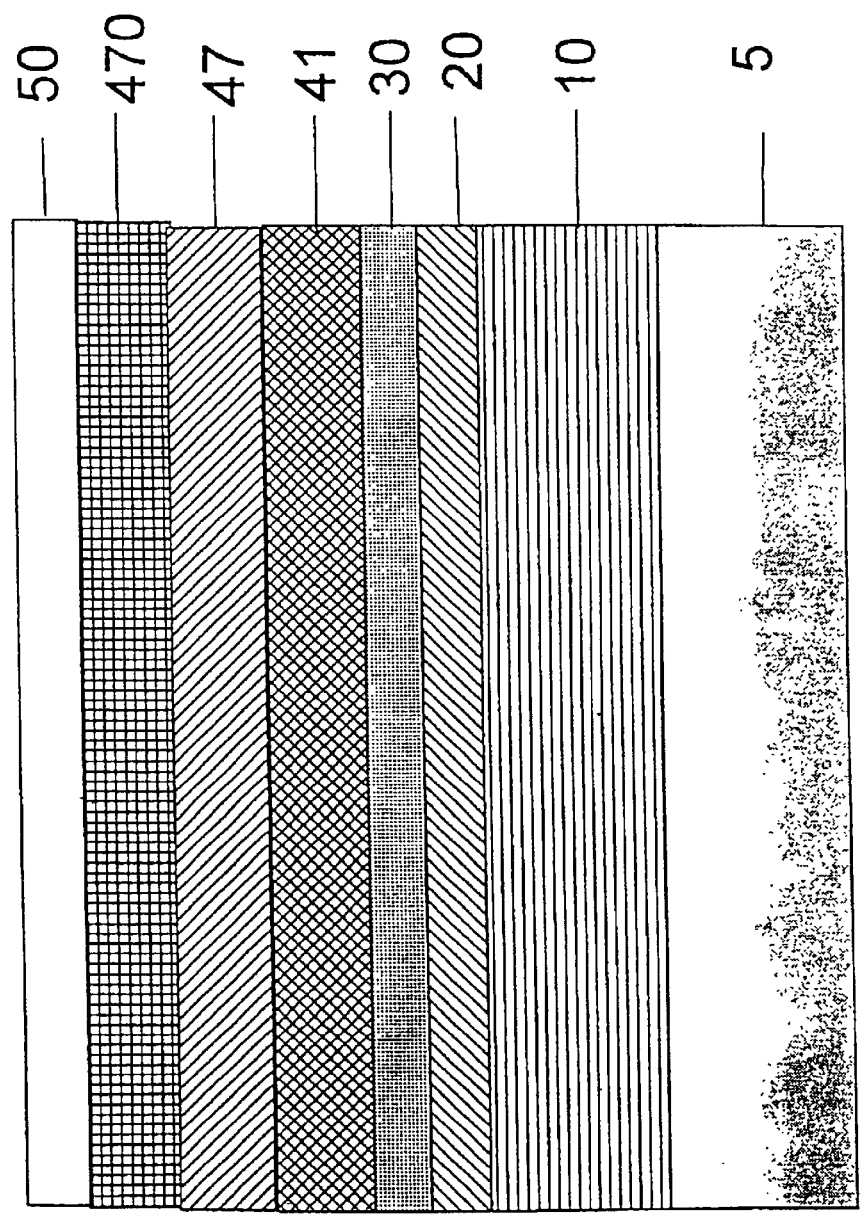
FIG. 17 is a schematic of the cross section of FIG. 11 where an additional single crystalline uniform composition SiGe layer 470 of identical composition as the top region of layer 47 is deposited homoepitaxially on layer 47. A strained Si cap layer 50 is deposited on top of layer 470.

In FIG. 17, layer 470 is a SiGe layer that has the same atomic % Ge as the top of layer 47. The thickness of layer 470 is between 100 nm and 1000 nm, preferably between 300 nm and 500 nm and the threading dislocation density is not higher than that of layer 47. Layer 50 is a strictly pseudomorphic strained Si layer with a thickness between 50 and 350 nm, preferably about 200 nm.

Figure 18:
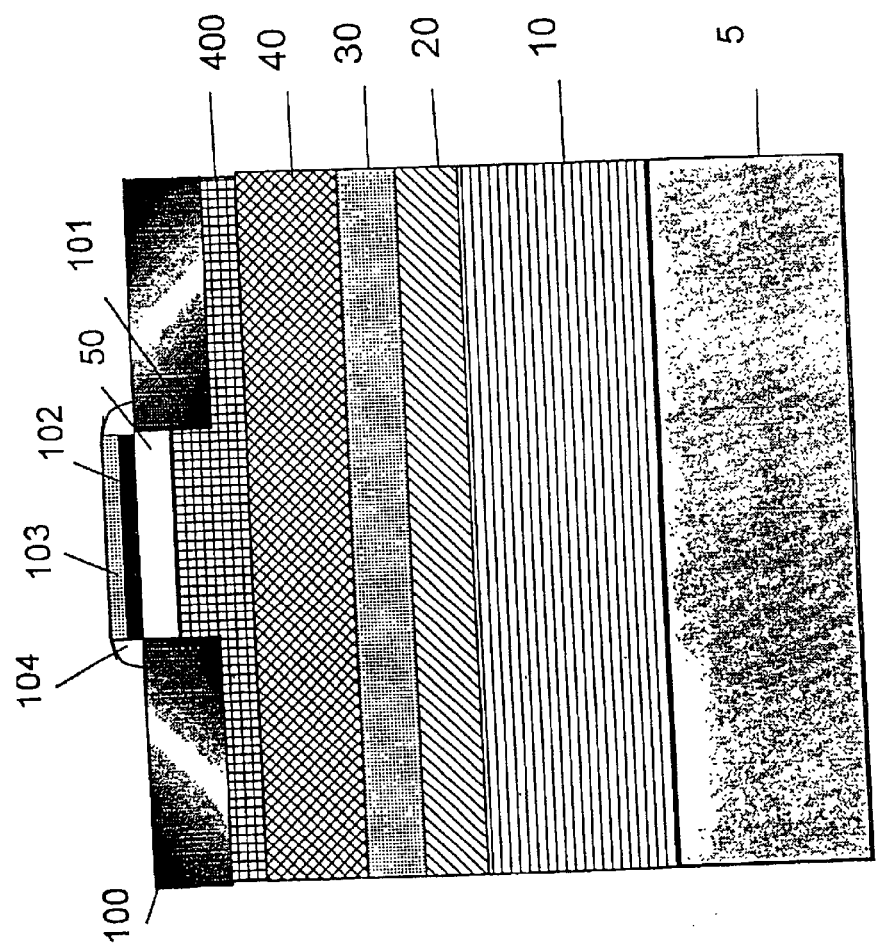
FIG. 18 is a schematic of the cross section of FIG. 12 where a field effect transistor (FET) is fabricated on the structure. The FET comprises source contact 100, drain contact 101, gate oxide layer 102, gate contact 103 and gate side-wall insulation 104.

The structures described above and in FIGS. 12–17 can be used to fabricate semiconductor devices. One embodiment is an integrated circuit consisting of at least one semiconductor device such as the field effect transistor (FET) shown in FIG. 18. The FET shown in FIG. 18 is fabricated by way of illustration on the layer structure of FIG. 12. In FIG. 18, the source contact is 100, the drain contact is 101, the gate dielectric is 102, the gate contact is 103 and the side-walls are 104. The device structure of FIG. 18 could also be built on the layer structures of FIGS. 13, 14, 15, 16 and 17, where layer 400 would be replaced by layer 410, 450, 460, 440 or 470 respectively.

Figure 19:
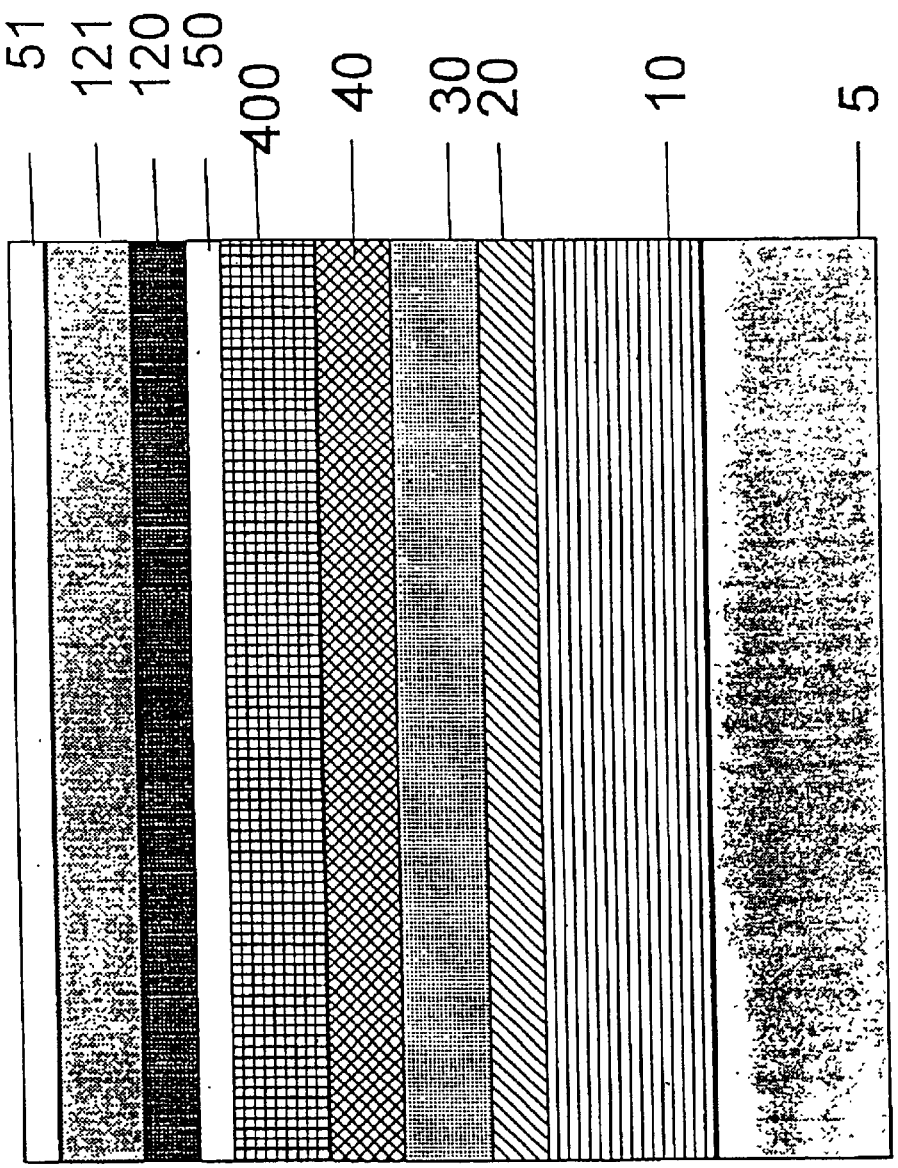
FIG. 19 is a schematic of the cross section of a n-type modulation-doped FET (MODFET) layer structure deposited on the structure of FIG. 12.
Figure 20:
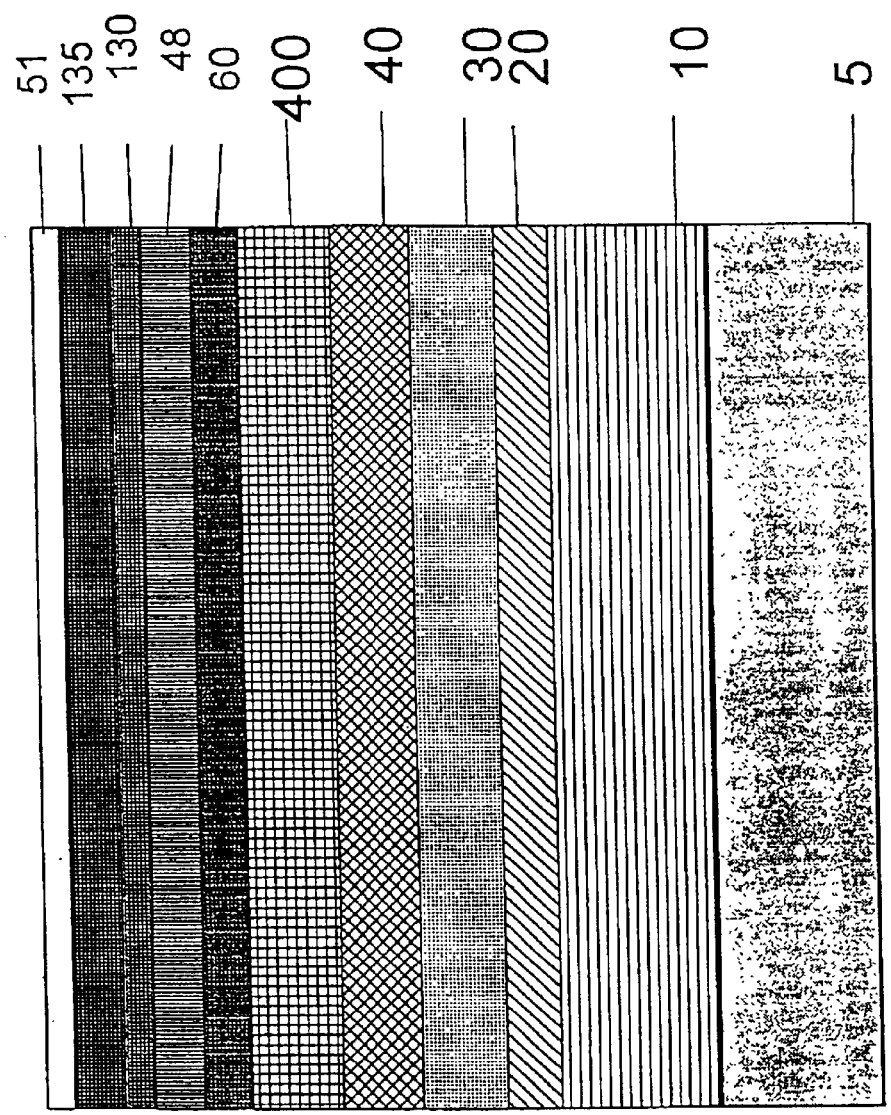
FIG. 20 is a schematic of the cross section of a p-type MODFET structure deposited on the structure of FIG. 12.

The modulation-doped field effect transistor (MODFET) layer structures shown in FIGS. 19 and 20 can also be grown epitaxially on the layer structures of FIGS. 12–17. The structure of FIG. 19 is fabricated by way of illustration on the structure of FIG. 12. The structure comprises a SiGe layer 120 of the same composition as layer 40 and 400, an n+ doped SiGe layer 121 of otherwise the similar composition as layer 120, and a pseudomorphic strained Si cap layer 51. The same layer structure could be grown on the structures of FIGS. 13, 14, 15, 16 and 17, where layer 400 would be replaced by layer 410, 450, 460, 440 or 470 respectively.

Alternatively, the MODFET layer structure in FIG. 20 can be grown epitaxially on the structure of FIG. 12 without the strained Si layer 50. This structure comprises a p+ doped SiGe layer 60 of otherwise the same composition as layer 40 and 400, a SiGe layer 48 of the same composition as layer 40 and 400, a pseudomorphic compressively strained SiGe layer 130 with a Ge content that is substantially higher than in layer 40 and 400, a SiGe layer 135 of the same composition as layer 40, and a pseudomorphic strained Si cap 51. The same layer structure can also be built on the structure of FIGS. 13, 14, 15, 16 and 17, also without the strained Si layer 50, where layer 400 would be replaced by layer 410, 450, 460, 440 or 470 respectively.

Figure 21:
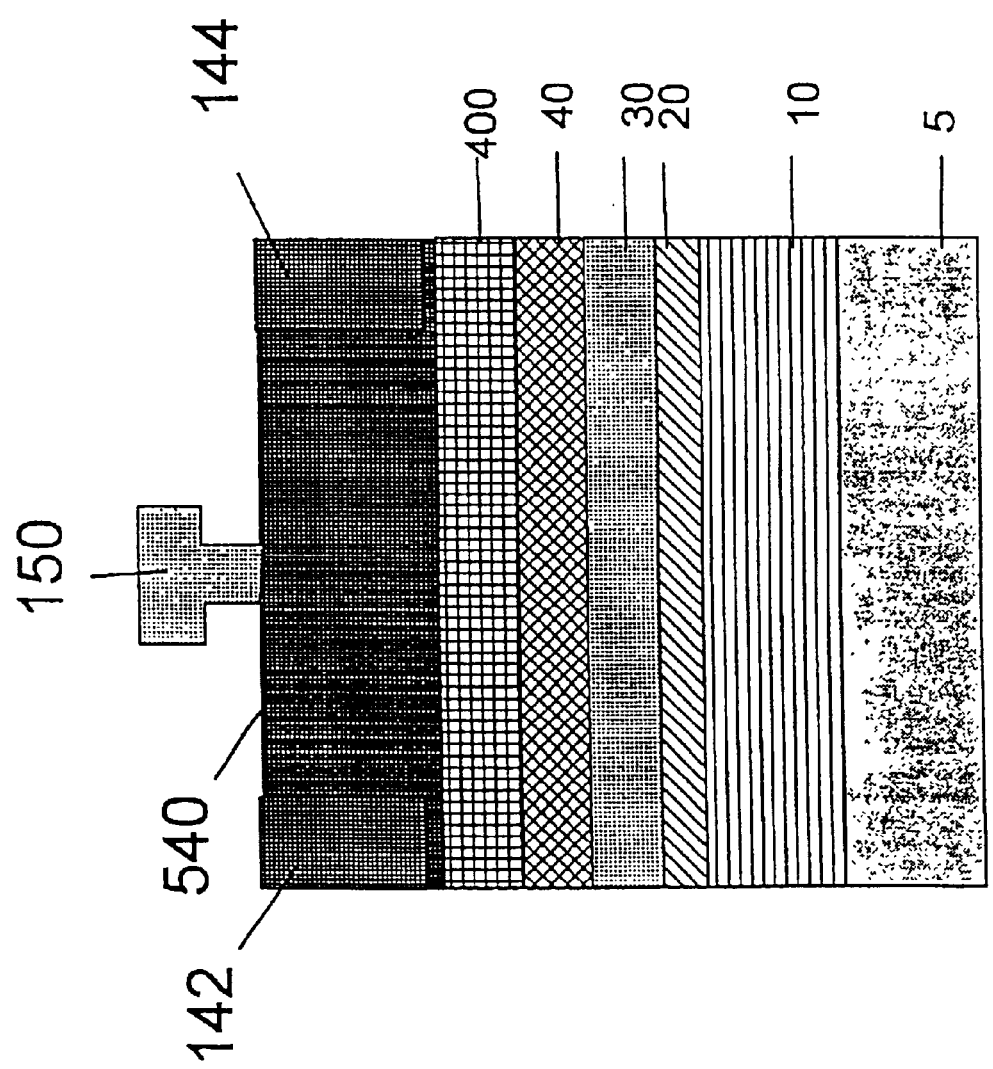
FIG. 21 is a schematic of the cross section of a structure where a MODFET device is fabricated on the structures of FIG. 19 or 20.

Another embodiment of an integrated circuit consisting of at least one semiconductor device such as the MODFET is illustrated in FIG. 21. The device shown in FIG. 21 is built on the layer structure of FIG. 19. In FIG. 21, layer 540 comprises all the layers above layer 400 as described in FIG. 19. The MODFET comprises source contact 142, drain contact 144, and T-gate 150. Alternatively the MODFET can be fabricated on the layer structure of FIG. 20. In this case, layer 540 in FIG. 21 comprises all the layers above 400 as described in FIG. 20.

Figure 22:
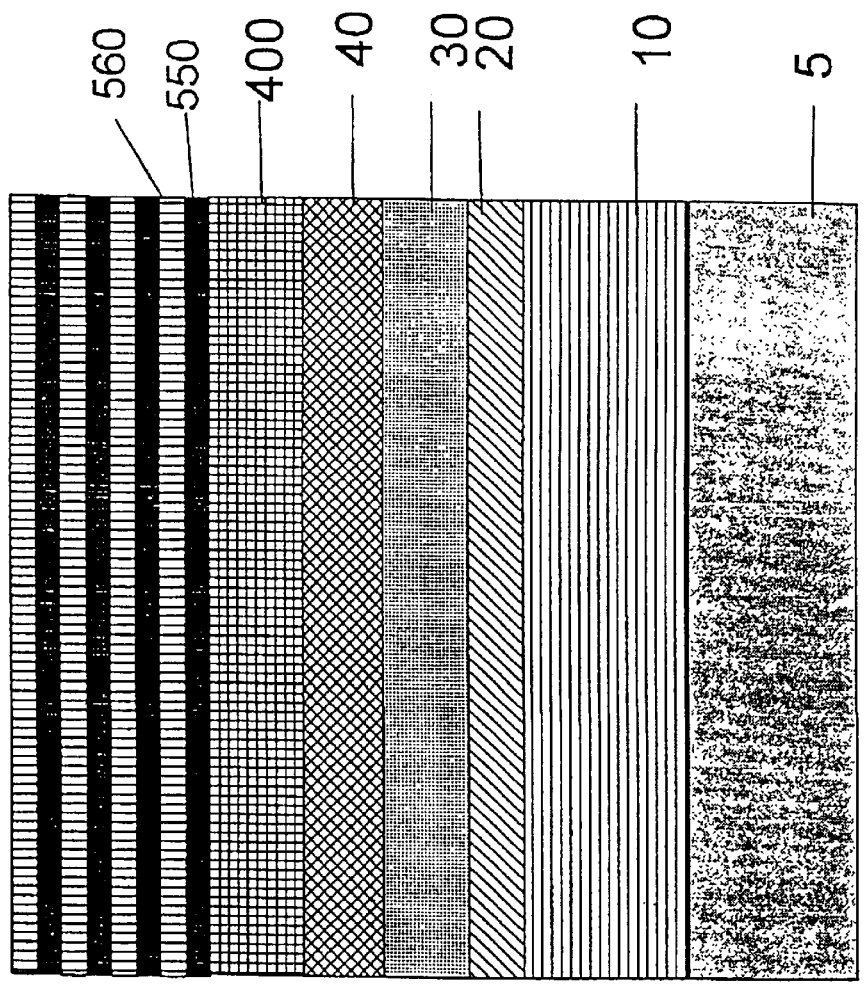
FIG. 22 is a schematic view of the cross section of a structure comprising a superlattice consisting of alternating layers 550 and 560 deposited on top of the structure of FIG. 12 without the strained Si cap layer 50.

Strain relaxed SiGe buffer layers can also be used for a variety of other applications. Some potential applications, e.g., thermoelectric cooling devices, require a superlattice structure which can be grown epitaxially on the layer structure shown in FIG. 12, but without the strained Si layer 50, as shown in FIG. 22. Layer 400 is optional. The superlattice structure consists of a repetition of alternating layers 550 and 560, both pseudomorphic strained epitaxial layers wherein the composition of layer 550 is different from the compositions of layers 560. In a specific case, the alternating layers are $Si_{1-x-y}Ge_xC_y$ and $Si_{1-z-w}Ge_zC_w$, wherein x and y are different from z and w, respectively and x and y can be equal to zero. The described superlattice structure can optionally be built on the structures of FIG. 13, 14, 15, 16 or 17, also without the strained Si cap layer 50, where layer 400 would be replaced by layer 410, 450, 460, 440 or 470, respectively. The described superlattice structure can optionally be built on the structures of FIG. 13, 14, 15, 16 or 17, also without the strained Si cap layer 50 and without the layers 410, 450, 460, 440 or 470, respectively.

Our recent work has shown that good quality relaxed $Si_{1-x}Ge_x$ buffer layers with threading dislocation densities less than $1 \times 10^6$ cm$^{-2}$ can be fabricated using the method of ion implantation and annealing described above, even when the initial epitaxial $Si_{1-x}Ge_x$ layer is not strictly pseudomorphic, but is instead nearly pseudomorphic. By nearly pseudomorphic we mean that there is a very low density of 60° misfit dislocations at the $Si_{1-x}Ge_x$/Si interface. As an example, the misfit dislocation density in a $Si_{0.80}Ge_{0.20}$/Si structure should be low enough that the change of the in-plane lattice parameter of the $Si_{1-x}Ge_x$ layer should correspond to a relaxation of the lattice mismatch strain in the SiGe layer of less than 5% and preferably less than 2% as measured by high resolution x-ray diffraction. Since the lattice mismatch strain in a pseudomorphic $Si_{0.80}Ge_{0.20}$ layer is 0.008, this corresponds to a decrease in lattice mismatch strain of less than 0.0004 and preferably less than 0.00016. When too much strain relaxation occurs during growth of the initial $Si_{1-x}Ge_x$ layer, the threading dislocation density after implant and anneal will exceed $1 \times 10^6$ cm$^{-2}$.

60° misfit dislocations nucleate by various mechanisms during epitaxial growth of a $Si_{1-x}Ge_x$ layer. At low lattice mismatch, the dominant mechanism in $Si_{1-x}Ge_x$ grown on Si(001) is Frank-Read multiplication (F. K. LeGoues, B. S. Meyerson, J. F. Morar, Phys. Rev. Lett. 66, 2903 (1991); F. K. LeGoues, B. S. Meyerson, J. F. Morar, P. D. Kirchner, J. Appl. Phys. 71, 4230 (1992), U.S. Pat. No. 5,659,187; K. W.

Schwarz and F. K. Legouse, Phys. Rev. Lett. 79, 1877 (1997); K. W. Schwarz and J. Tersoff, Appl. Plys. Lett. 69, 1220 (1996).). In this mechanism, many dislocations are nucleated at each Frank-Read source, thus forming misfit dislocation pileups containing several or even as many as several 10s of misfit dislocations, depending on the growth conditions (D. J. Robbins, J. L. Glasper, D. Wallis, A. C. Churchill, A. J. Pidduck and W. Y. Leong, in *Lattice Mismatched Thin Films*, Ed. E. A. Fitzgerald (The Minerals, Metals, & Materials Society, Warrendale, Pa., 1999) pp. 3–11). A surface step, one atom high, is associated with each 60° misfit dislocation. Thus the height of the surface step associated with a dislocation pileup is a measure of the number of misfit dislocations in that pileup.

The misfit dislocation density in these structures may be observed by atomic force microscopy (AFM), a nondestructive method that allows the observation of surface steps associated with the 60° misfit dislocations at the buried $Si_{1-x}Ge_x/Si$ interface. FIG. 23A shows an as-grown nearly pseudomorphic $Si_{0.81}Ge_{0.19}$ layer on a Si(001) substrate. Single misfit dislocations (very faint lines) and misfit dislocation pileups (stronger lines) are seen on this micrograph. FIGS. 2B and 23B are micrographs of implanted and annealed $Si_{1-x}Ge_x/Si$ structures showing a high density of misfit dislocations, indicating that substantial strain relaxation has occurred. FIG. 23B shows a dislocation pileup (marked with an arrow) that was present in the as-grown layer prior to implantation and annealing. In contrast, the structure of FIG. 2B was originally a strictly pseudomorphic layer; no misfit dislocation pile-ups are seen in this image The practice of this invention results in AFM images similar to those in FIGS. 2B and 23B.

Figure 24:
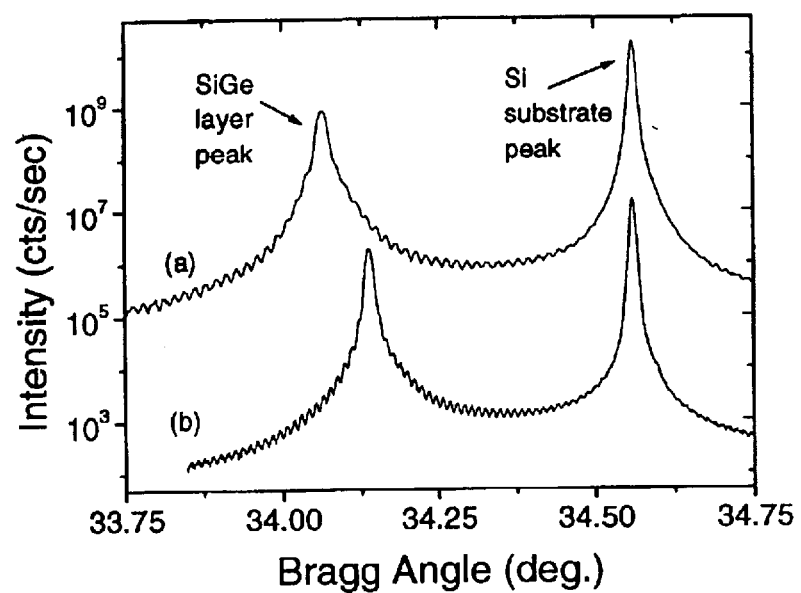
FIG. 24A shows HRXRD scans of a nearly pseudomorphic Si$_{1-x}$Ge$_x$ layer and FIG. 24B shows a strictly pseudomorphic Si$_{1-x}$Ge$_x$ layer grown epitaxially by UHVCVD on a Si (001) substrate.

The degree of strain relaxation of the initial nearly pseudomorphic layer is typically measured by high-resolution x-ray diffraction (HRXRD), also a nondestructive measurement method. FIG. 24 shows 004 rocking curves for two samples before implantation and annealing: (a) is a 334 nm-thick, nearly pseudomorphic, $Si_{0.81}Ge_{0.19}$ layer and (b) is a 460 nm-thick, strictly pseudomorphic, $Si_{0.85}Ge_{0.15}$ layer. Note that both the SiGe layer and the Si substrate peaks of curve (a) are broader and that the thickness fringes associated with the SiGe layer peak the nearly pseudomorphic layer (a) are not as sharp as those of the strictly pseudomorphic layer (b). The strain relaxation in both samples was measured to be 0%; the misfit dislocations introduce local strains, but their density in this structure is too low to cause a detectable change in the lattice parameter of the SiGe layer.

Figure 25:
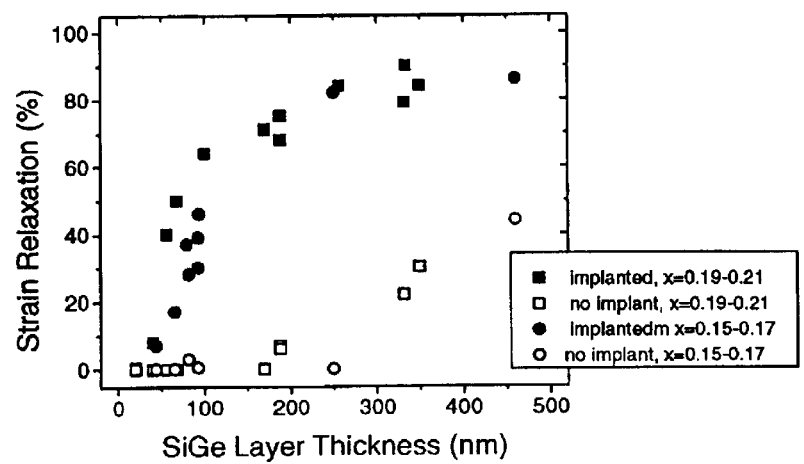
FIG. 25 shows the degree of strain relaxation of Si$_{1-x}$Ge$_x$ layers of various alloy composition and thickness with and without implanted He+ measured by high-resolution x-ray diffraction after the samples were annealed at 800° C. for 2 hrs.

Using the method of ion-implantation and annealing as described above, we can achieve substantially relaxed $Si_{1-x}Ge_x$ buffer layers with smooth surfaces (root mean square (RMS) surface roughness less than 0.8 nm) and a low threading dislocation density (less than $1\times10^6$ cm$^{-2}$) when the initial $Si_{1-x}Ge_x$ layer is nearly pseudomorphic. The nearly pseudomorphic $Si_{1-x}Ge_x$ layer may be as much as 1000 nm thick, preferably less than 700 nm thick, depending on the $Si_{1-x}Ge_x$ alloy composition and epitaxial growth conditions. The data in FIG. 25 show that the degree of strain relaxation after annealing increases with the thickness of the $Si_{1-x}Ge_x$ layer and that implanting He below the $Si_{1-x}Ge_x/Si$ interface significantly enhances the degree of strain relaxation that occurs during annealing, even for thicker layers. Table I shows data for $Si_{1-x}Ge_x$ layers of different alloy composition and thickness that were relaxed by He$^+$ implantation and annealing. The threading dislocation density is typically less than $2\times10^5$ cm$^{-2}$, even for thicker nearly pseudomorphic $Si_{1-x}Ge_x$ layers.

Table I shows the degree of relaxation, surface roughness and threading dislocation density in implanted and annealed layers. The uncertainty in the degree of relaxation is plus or minus 2%, in the alloy composition is plus or minus 0.05 and in the dislocation count is ~20%. The $Si_{1-x}Ge_x$ layer thickness was measured by high-resolution x-ray diffraction prior to strain relaxation. The threading dislocations were counted using atomic force microscopy images, and also by planar view transmission electron microscopy for selected samples.

TABLE I

| alloy Composition, x | layer thickness [nm] | strain relaxation [%] | RMS roughness [nm] | Threading dislocation density [×10$^5$ cm$^{-2}$] |
|---|---|---|---|---|
| 0.15 | 460 | 86 | 0.60 | 0.8[a,b] |
| 0.15 | 250 | 82 | 0.62 | 2.0[a,b] |
| 0.17 | 101 | 47 | 0.29 | 2–3[a] |
| 0.19 | 97 | 46 | 0.39 | <2.0[a] |
| 0.19 | 170 | 70 | 0.40 | <2.0[a,b] |
| 0.19 | 256 | 84 | 0.52 | <2.0[a,b] |
| 0.19 | 334 | 90 | 0.79 | <2.0[a,b] |
| 0.21 | 110 | 64 | 0.28 | 0.4[a] |
| 0.21 | 188 | 75 | 0.47 | 6.0[a,b] |

In Table I, superscript "a" refers to atomic force microscopy and superscript "b" refers to planar-view transmission electron microscopy.

A SiGe layer that is thicker than the initial implanted and annealed buffer (IAB) layer may be required for device applications. Therefore, a second $Si_{1-x}Ge_x$ layer of the same alloy composition as the initial IAB layer or a second $Si_{1-y}Ge_y$ layer where y<x that is unstrained, i.e. that is 100% relaxed, may be grown epitaxially on the initial implanted and annealed buffer "virtual substrate". The latter case is achieved by selecting the alloy composition of the $Si_{1-y}Ge_y$ layer so that the lattice parameter of the second layer in the direction parallel to the wafer surface is equal to that of the partially strain-relaxed initial $Si_{1-x}Ge_x$ initial implanted and annealed buffer layer.

When a second $Si_{1-y}Ge_y$ layer is grown epitaxially on a first $Si_{1-x}Ge_x$ layer, for example on a partially relaxed initial implanted and annealed buffer "virtual substrate", it may be desirable to initiate the growth of subsequent epitaxial layers with a thin layer of $Si_{1-z}Ge_z$ having a very low Ge content, specifically z less than 0.1 preferably 0<z<0.06. The thickness of this intermediate layer should not exceed the critical thickness for strain relaxation as described previously.

The following examples are given to illustrate the inventive process used in fabricating a "virtual substrate", i.e., a thin relaxed epitaxial $Si_{1-x}Ge_x$ layer formed on top of a Si or SOI substrate as well as the use of that "virtual substrate" as a component of an electronic structure.

EXAMPLE 1

In this example, a "virtual substrate" was fabricated by depositing a 100 nm thick pseudomorphic $Si_{0.85}Ge_{0.15}$ layer on a bulk Si substrate. The resultant structure was then implanted with He$^+$ at a dose of about $1\times10^{16}$ cm$^{-2}$, using an implant energy of about 21 keV. The structure was subsequently annealed at approximately 850° C. for about 1 hour. HRXRD measurements after annealing show that 41% of the lattice mismatch strain was relieved. The sample had an RMS surface roughness of about 0.29 nm and an etch pit (TD) density of about $1\times10^5$ cm$^{-2}$.

EXAMPLE 2

A second implementation of the inventive process was also done according to the structure of FIG. 6, where layers 5 and 10 are a bulk Si substrate and layer 40 is a 100 nm thick pseudomorphic $Si_{0.85}Ge_{0.15}$ layer as measured by HRXRD prior to ion implantation. $He^+$ was implanted at a dose of about $1\times10^{16}$ cm$^{-2}$, using an implant energy of about 21 keV. The wafer was subsequently annealed at approximately 850° C. for about 30 min. The SiGe layer was about 38% relaxed.

EXAMPLE 3

A third implementation of the inventive process was also done according to the structure of FIG. 6, where layers 5 and 10 are a bulk Si substrate and layer 40 is an 188 nmthick $Si_{0.79}Ge_{0.21}$ pseudomorphic layer as measured by HRXRD prior to ion implantation. $He^+$ was implanted at a dose of about $0.8\times10^{16}$ cm$^{-2}$ and at an energy of about 31 keV. The wafer was subsequently annealed at approximately 850° C. for about 1 hour. The SiGe layer was 69% relaxed. The RMS surface roughness was about 0.47 nm, and the etch pit (TD) density was about $2.7\times10^5$ cm$^2$.

EXAMPLE 4

A fourth implementation of the inventive process was also done according to the structure of FIG. 6, where layers 5 and 10 are a bulk Si substrate and layer 40 is an 188 nm thick pseudomorphic $Si_{0.79}Ge_{0.21}$ layer as measured by HRXRD prior to ion implantation. $He^+$ was implanted at a dose of about $1.2\times10^{16}$ cm$^{-2}$ and at an energy of about 31 keV. The wafer was subsequently annealed at approximately 850° C. for about 1 hour. The SiGe layer was 68% relaxed, the RMS surface roughness was about 0.48 nm and the etch pit (TD) density was about $0.9\times10^5$ cm$^{-2}$.

EXAMPLE 5

One example of a nearly pseudomorphic layer is a 460 nm-thick $Si_{1-x}Ge_x$ x=0.15 layer grown by ultra-high vacuum chemical vapor deposition (UHVCVD) that is 86% relaxed and has an RMS surface roughness of 0.6 nm and a threading dislocation density of $0.8\times10^5$ cm$^{-2}$.

EXAMPLE 6

Another example of a nearly pseudomorphic layer is a 334 nm-thick $Si_{1-x}Ge_x$ x=0.19 layer grown by UHVCVD that is 90% relaxed and has an RMS surface roughness of 0.8 nm and a threading dislocation density of $<2\times10^5$ cm$^{-2}$.

EXAMPLE 7

An example of a second $Si_{1-y}Ge_y$ layer grown on an $Si_{1-x}Ge_x$ IAB layer where y<x is a 76% relaxed, $Si_{0.80}Ge_{0.20}$ initial implanted and annealed buffer layer upon which a 100 nm of $Si_{0.85}Ge_{0.15}$ was grown. After the growth of the second layer, the initial $Si_{0.80}Ge_{0.20}$ IAB layer was found to remain 76% relaxed and the second $Si_{0.85}Ge_{0.15}$ layer was measured to be 100% relaxed.

EXAMPLE 8

An example of the use of an interlayer between the initial $Si_{1-x}Ge_x$ layer and a second $Si_{1-y}Ge_y$ layer is to first grow 15 nm of $Si_{0.95}Ge_{0.05}$ followed by 100 nm of $Si_{0.19}Ge_{0.81}$ on top of a 256 nm-thick, 84% relaxed, $Si_{0.19}Ge_{0.81}$ initial implanted a annealed buffer layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a relaxed epitaxial $Si_{1-x}Ge_x$ layer with a low-density of threading dislocations on a single crystalline surface comprising the steps of:
   depositing a nearly pseudomorphic epitaxial layer of $Si_{1-x}Ge_x$ atop a single crystalline surface of a substrate;
   implanting atoms of light elements in said substrate; and
   annealing said substrate at a temperature above 650° C.

2. The method of claim 1 wherein said substrate is a bulk Si substrate or a Si-on-insulator substrate.

3. The method of claim 1 wherein said single crystalline surface comprises a layer of Si, $Si_{1-x}Ge_x$, Ge, $Si_{1-y}C_y$, or $Si_{1-x-y}Ge_xC_y$.

4. The method of claim 1 wherein said nearly pseudomorphic epitaxial layer of $Si_{1-x}Ge_x$ is deposited using a high vacuum deposition technique selected from the group consisting of molecule beam epitaxy (MBE), chemical vapor deposition (CVD), plasma enhanced chemical vapor deposition (PECVD), atomic layer chemical vapor deposition (ALCVD) on assisted deposition and chemical beam epitaxy.

5. The method of claim 1 wherein said nearly pseudomorphic $Si_{1-x}Ge_x$ layer has a uniform composition with a Ge fraction x in the range of from about 0.01 to about 1, or a graded composition with the Ge fraction x increasing from 0, at the interface with said top crystalline surface, to higher x values in the range of from about 0.01 to about 1 at the top surface of the pseudomorphic layer.

6. The method of claim 1 further comprising the step of chemical mechanical polishing (CMP) said nearly pseudomorphic $Si_{1-x}Ge_x$ layer to a surface roughness in the range from about 0.1 nm to about 1 nm.

7. The method of 1 wherein said nearly pseudomorphic $Si_{1-x}Ge_x$ layer has a surface roughness in the range from about 0.1 nm to about 1 nm.

8. The method of claim 1 wherein the implanted ions comprise H, He, D, B, N or mixtures thereof.

9. The method of claim 1 wherein the implanted ions are He ions.

10. The method of claim 9 wherein the He ions are implanted at doses in the range of from about $4\times10^{15}$ to about $4\times10^{16}$ cm$^{-2}$.

11. The method of claim 1 wherein the implanted atoms are essentially concentrated in said substrate, far below (>150 nm) the single crystalline surface so that a minimum amount of implanted atoms is contained in the epitaxial layer and at the interface between said single crystalline surface and said epitaxial layer.

12. The method of claim 1 wherein said ion implantation depth is in the range of 90 to 300 nm below an interface located between the said top single crystalline surface and said nearly pseudomorphic $Si_{1-x}Ge_x$ layer.

13. The method of claim 1 wherein said annealing is performed in a non-oxidizing ambient or a partially oxidizing ambient.

14. The method of claim 1 wherein the relaxed epitaxial $Si_{1-x}Ge_x$ layer has a density of threading dislocations of less than $10^6$ cm$^{-2}$.

15. The method of claim 1 wherein the relaxed epitaxial $Si_{1-x}Ge_x$ layer has a surface roughness in the range of from about 0.1 to about 1 nm.

16. A method for preparing a relaxed epitaxial $Si_{1-x}Ge_x$ layer on a single crystalline surface comprising the steps of:

depositing a nearly pseudomorphic epitaxial layer of $Si_{1-x}Ge_x$ atop a single crystalline surface of a substrate;

ion implanting atoms of a first type of light elements in said substrate;

ion implanting atoms of a second type of light elements in said substrate; and annealing said substrate at temperatures above 650° C.

17. The method of claim 16 wherein the implanted ions of said first type and said second type comprise H, He, D, B, N or mixtures thereof.

18. The method of claim 16 wherein the implanted ions of said first type are He ions.

19. The method of claim 18 wherein the He ions are implanted at doses in the range of from about $4 \times 10^{15}$ to about $4 \times 10^{16}$ cm$^{-2}$.

20. The method of claim 16 wherein the implanted ions of said second type comprise H, D or B.

21. The method of claim 20 wherein the implanted ions of said second type are implanted at doses in the range of from about $4 \times 10^{15}$ to about $4 \times 10^{16}$ cm$^{-2}$.

22. The method of claim 16 wherein the implanted atoms are essentially concentrated in said substrate, far below the single crystalline surface so that a minimum amount of implanted atoms is contained in the epitaxial layer and at the interface between said single crystalline surface and said epitaxial layer.

23. The method of claim 16 wherein said ion implanting steps are performed at the same depth or at two different depths.

24. The method of claim 16 wherein the relaxed epitaxial $Si_{1-x}Ge_x$ layer has a density of threading dislocations of less than $10^6$ cm$^{-2}$.

25. The method of claim 16 wherein the relaxed epitaxial $Si_{1-x}Ge_x$ layer has a surface roughness in the range of from about 0.1 to about 1 nm.

26. A method for preparing a relaxed epitaxial $Si_{1-x}Ge_x$ layer on a single crystalline surface comprising the steps of:

(a) providing a substrate having a top single crystalline surface;

(b) depositing a first nearly pseudomorphic epitaxial layer of $Si_{1-x}Ge_x$ on top of said single crystalline surface;

(c) ion implanting atoms of light elements in said substrate;

(d) annealing said substrate at temperatures above 650° C.; and performing steps (b)–(d) at least twice, wherein the epitaxial layers beyond the first one is not strictly pseudomorphic and x in the subsequent step is larger than x in the preceding step.

27. The method of claim 26 wherein the implanted atoms are essentially concentrated in said substrate, far below the single crystalline surface so that a minimum amount of implanted atoms is contained in the epitaxial layer and at the interface between said single crystalline surface and said epitaxial layer.

28. The method of claim 26 wherein said ion implantation depth is in the range of from 90 to 300 nm below the interface between the last epitaxial layer and the preceding layer.

29. A method for preparing a relaxed epitaxial $Si_{1-x}Ge_x$ layer on a single crystalline surface comprising the steps of:

(a) providing a substrate having a top single crystalline surface;

(b) depositing a first nearly pseudomorphic epitaxial layer of $Si_{1-x}Ge_x$ on top of said single crystalline surface;

(c) ion implanting atoms of light elements in said substrate;

(d) annealing the substrate at temperatures above 650° C.;

(e) depositing a second epitaxial layer of $Si_{1-y}Ge_y$ on top of said single crystalline surface, wherein y>x;

(f) annealing said substrate at temperatures above 650° C.; and (g) performing steps e–f at least once.

30. The method of claim 29 wherein steps (e) and (f) are repeated at least one time more.

31. The method of claim 29 wherein said first and subsequent epitaxial $Si_{1-x}Ge_x$ layers have a uniform composition with a Ge fraction x in the range of from about 0.01 to about 1.

32. The method of claim 29 wherein said first nearly pseudomorphic $Si_{1-x}Ge_x$ layer has a graded composition with the Ge fraction x increasing from 0, at the interface with said single crystalline surface, to higher x values in the range of from about 0.01 to about 1 at the top of the first nearly pseudomorphic layer.

33. The method of claim 29 wherein the subsequent nearly pseudomorphic $Si_{1-y}Ge_y$ layers have a graded composition with the Ge fraction y changing from that equal to the value at the top of the precedent pseudomorphic layer, to higher y values in the range of from about 0.01 to about 1 at the top surface of the subsequent layers.

34. The method of claim 29 wherein the subsequent nearly pseudomorphic $Si_{1-y}Ge_y$ layer has a graded composition whereby the Ge fraction y is initially equal to the value at the top of the precedent nearly pseudomorphic layer and then increased in a linear manner to higher y values in the range of from about 0.01 to about 1 at the upper surface of the subsequent nearly pseudomorphic layer.

35. The method of claim 29 further comprising the step of chemical mechanical polishing the $Si_{1-x}Ge_x$ to a surface roughness in the range from about 0.1 nm to about 1 nm.

36. The method of claim 29 wherein the nearly pseudomorphic $Si_{1-y}Ge_y$ layer has a surface roughness in the range of from about 0.1 nm to about 1 nm.

37. The method of claim 29 wherein the top relaxed epitaxial SiGe layer has a density of threading dislocations of less than 106 cm–2.

38. The method of claim 29 wherein the top relaxed epitaxial Si1-xGex layer has a surface roughness in the range of from about 0.1 to about 1 nm.

39. A method for preparing a relaxed epitaxial $Si_{1-x}Ge_x$ layer with low density of threading dislocations on a single crystalline surface comprising the steps of:

providing a substrate having a top single crystalline surface;

depositing a first epitaxial layer of a material that is the same as that of the said top single crystalline surface and containing additional C atoms;

depositing a second epitaxial layer of a material that is the same as that of the said top single crystalline surface and containing no additional C atoms;

depositing a third nearly pseudomorphic epitaxial layer of $Si_{1-x}Ge_x$ on top of said single crystalline surface; and annealing the said substrate at temperatures above 650° C.

40. The method of claim 39 wherein the C atoms in said second epitaxial layer are at concentration in the range of 1×1019 to 2×1021 cm–3.

41. The method of claim 39 wherein the thickness of said first carbon containing epitaxial layer is between 20 nm and 110 nm.

42. The method of claim 39 wherein said first carbon containing epitaxial layer has a surface roughness in the range from about 0.1 nm to about 1 nm.

43. The method of claim 39 wherein the thickness of said second epitaxial layer is between 90 nm and 300 nm thick.

44. The method of claim 39 wherein said relaxed epitaxial Si1-xGex layer has a density of threading dislocations of less than 106 cm−2.

45. The method of claim 39 wherein the relaxed epitaxial Si1-xGex layer has a surface roughness in the range from about 0.1 to about 1 nm.

46. A method for preparing a relaxed $Si_{1-x}Ge_x$ layer on a single crystalline surface comprising the steps of:
(a) providing a substrate having a top single crystalline surface;
(b) depositing a first nearly pseudomorphic epitaxial layer of $Si_{1-x}Ge_x$ on top of said single crystalline surface;
(c) ion implanting atoms of light elements in said substrate;
(d) annealing the substrate at temperatures above 650° C.;
(e) depositing a second layer of $Si_{1-y}Ge_y$ on top of said single crystalline surface wherein y=x or y<x.

47. The method of claim 46 wherein said first and subsequent epitaxial $Si_{1-x}Ge_x$ layers have a uniform composition with a Ge fraction x in the range of from about 0.01 to about 1.

48. The method of claim 46 wherein said first nearly pseudomorphic $Si_{1-x}Ge_x$ layer has a graded composition with the Ge fraction x increasing from 0, at the interface with said single crystalline surface, to higher x values in the range of from about 0.01 to about 1 at the top of the first nearly pseudomorphic layer.

49. The method of claim 46 wherein the subsequent nearly pseudomorphic $Si_{1-y}Ge_y$ layers have a graded composition with the Ge fraction y changing from that equal to the value at the top of the precedent nearly pseudomorphic layer, to higher y values in the range of from about 0.01 to about 1 at the top surface of the subsequent layers.

50. The method of claim 46 wherein the subsequent nearly pseudomorphic $Si_{1-y}Ge_y$ layer has a graded composition whereby the Ge fraction y is initially equal to the value at the top of the precedent nearly pseudomorphic layer and then increased in a linear manner to higher y values in the range of from about 0.01 to about 1 at the upper surface of the subsequent nearly pseudomorphic layer.

51. The method of claim 46 further comprising the step of chemical mechanical polishing the first nearly pseudomorphic Si1-xGex layer to a surface roughness in the range from about 0.1 nm to about 1 nm.

52. The method of claim 46 wherein the first nearly pseudomorphic $Si_{1-y}Ge_y$ layer has a surface roughness in the range of from about 0.1 nm to about 1 nm.

53. The method of claim 46 wherein the top relaxed epitaxial SiGe layer has a density of threading dislocations of less than 106 cm−2.

54. The method of claim 46 wherein the top relaxed epitaxial Si1-xGex layer has a surface roughness in the range of from about 0.1 to about 1 nm.

55. A method for preparing a relaxed $Si_{1-x}Ge_x$ layer on a single crystalline surface comprising the steps of:
(a) providing a substrate having a top single crystalline surface;
(b) depositing a first nearly pseudomorphic epitaxial layer of $Si_{1-x}Ge_x$ on top of said single crystalline surface;
(c) ion implanting atoms of light elements in said substrate;
(d) annealing the substrate at temperature above 650° C.;
(e) depositing a second epitaxial layer of $Si_{1-y}Ge_y$ on top of said single crystalline surface wherein y=x or y<x.

56. The method of claim 55 wherein said first and subsequent epitaxial $Si_{1-x}Ge_x$ layers have a uniform composition with a Ge fraction x in the range of from about 0.01 to about 1.

57. The method of claim 55 wherein said first pseudomorphic $Si_{1-x}Ge_x$ layer has a graded composition with the Ge fraction x increasing from 0, at the interface with said single crystalline surface, to higher x values in the range of from about 0.01 to about 1 at the top of the first pseudomorphic layer.

58. The method of claim 55 wherein the subsequent pseudomorphic $Si_{1-y}Ge_y$ layers have a graded composition with the Ge fraction y changing from that equal to the value at the top of the precedent pseudomorphic layer, to higher y values in the range of from about 0.01 to about 1 at the top surface of the subsequent layers.

59. The method of claim 55 wherein the subsequent pseudomorphic $Si_{1-y}Ge_y$ layer has a graded composition whereby the Ge fraction y is initially equal to the value at the top of the precedent pseudomorphic layer and then increased in a linear manner to higher y values in the range of from about 0.01 to about 1 at the upper surface of the subsequent pseudomorphic layer.

60. The method of claim 55 further comprising the step of chemical mechanical polishing the $Si_{1-x}Ge_x$ to a surface roughness in the range from about 0.1 nm to about 1 nm.

61. The method of claim 55 wherein the pseudomorphic Si1-yGey layer has a surface roughness in the range of from about 0.1 nm to about 1 nm.

62. The method of claim 55 wherein the top relaxed epitaxial SiGe layer has a density of threading dislocations of less than 106 cm−2.

63. The method of claim 55 wherein the top relaxed epitaxial $Si_{1-x}Ge_x$ layer has a surface roughness in the range of from about 0.1 to about 1 nm.

* * * * *

UNITED STATES PATENT AND TRADEMARK OFFICE
CERTIFICATE OF CORRECTION

PATENT NO. : 6,855,649 B2
DATED : February 15, 2005
INVENTOR(S) : Jack Oon Chu et al.

It is certified that error appears in the above-identified patent and that said Letters Patent is hereby corrected as shown below:

Column 20,
Line 40, "106 cm-2" should read -- $10^6$ $cm^{-2}$ --.
Line 42, "Si1-xGex" should read -- $Si_{1-x}Ge_x$ --.
Line 61, "1x1019 to 2x1021 cm-3" should read -- $1x10^{19}$ to $2x10^{21}$ $cm^{-3}$ --.

Column 21,
Lines 4, 7 and 46, "Si1-xGex" should read -- $Si_{1-x}Ge_x$ --.
Lines 5 and 53, "106 cm-2" should read -- $10^6$ $cm^{-2}$ --.

Column 22,
Line 2, "Si1-xGex" should read -- $Si_{1-x}Ge_x$ --.
Line 44, "Si1-yGey" should read -- $Si_{1-y}Ge_y$ --.
Line 48, "106 cm-2" should read -- $10^6$ $cm^{-2}$ --.

Signed and Sealed this

Twenty-third Day of August, 2005

JON W. DUDAS
*Director of the United States Patent and Trademark Office*